(12) United States Patent
Benvenuti et al.

(10) Patent No.: US 11,214,867 B2
(45) Date of Patent: *Jan. 4, 2022

(54) VAPOR PHASE DEPOSITION SYSTEM

(71) Applicant: ABCD TECHNOLOGY SARL, Geneva (CH)

(72) Inventors: Giacomo Benvenuti, Ferney Voltaire (FR); Estelle Halary Wagner, Marseilles (FR); Christian Petit, Valdahon (FR)

(73) Assignee: ABCD TECHNOLOGY SARL, Geneva (CH)

( * ) Notice: Subject to any disclaimer, the term of this patent is extended or adjusted under 35 U.S.C. 154(b) by 259 days.

This patent is subject to a terminal disclaimer.

(21) Appl. No.: 16/520,488

(22) Filed: Jul. 24, 2019

(65) Prior Publication Data

US 2020/0010955 A1    Jan. 9, 2020

Related U.S. Application Data

(60) Division of application No. 15/263,275, filed on Sep. 12, 2016, now Pat. No. 10,400,334, which is a
(Continued)

(30) Foreign Application Priority Data

Oct. 8, 2008   (WO) .................. PCT/IB2008/054129

(51) Int. Cl.
*C23C 16/455*     (2006.01)
*C23C 14/24*      (2006.01)
(Continued)

(52) U.S. Cl.
CPC ...... *C23C 16/45565* (2013.01); *C23C 14/225* (2013.01); *C23C 14/24* (2013.01);
(Continued)

(58) Field of Classification Search
CPC ........ C23C 16/45565; C23C 16/45574; C23C 16/4558; C23C 16/48; C23C 14/24;
(Continued)

(56) References Cited

U.S. PATENT DOCUMENTS 5,772,771 A * 6/1998 Li ....................... C23C 16/4405
                                                                    118/715
5,781,693 A * 7/1998 Ballance ........... C23C 16/45565
                                                                    118/724
(Continued)

FOREIGN PATENT DOCUMENTS

WO    WO-2006082117 A1 * 8/2006    ....... C23C 16/45565

*Primary Examiner* — Jeffrie R Lund
(74) *Attorney, Agent, or Firm* — Nixon & Vanderhye P.C.

(57) ABSTRACT

A showerhead for vacuum deposition of several species, the showerhead being divided into several quarters containing each at least one outlet for the species, each of the quarter defining the wall of an underlying compartment containing at least one species, wherein two adjacent compartments contains different species. A process for vacuum deposition of one or more species onto a substrate, including providing a substrate for thin film growth in a growth chamber, providing two or more species to be effused towards the substrate, effusing the two or more species towards the substrate with line of sight propagation and in high vacuum conditions, and obtaining a thin film with gradients of chemical elements composition, morphology or crystalline phase.

6 Claims, 22 Drawing Sheets

Related U.S. Application Data continuation of application No. 13/123,225, filed as application No. PCT/IB2009/054421 on Oct. 8, 2009, now abandoned.

(51) Int. Cl.
| | |
|---|---|
| *C23C 14/22* | (2006.01) |
| *C23C 16/48* | (2006.01) |
| *C23C 16/00* | (2006.01) |
| *C23C 16/30* | (2006.01) |
| *C23C 16/44* | (2006.01) |

(52) U.S. Cl.
CPC .............. *C23C 16/00* (2013.01); *C23C 16/30* (2013.01); *C23C 16/44* (2013.01); *C23C 16/4558* (2013.01); *C23C 16/45563* (2013.01); *C23C 16/45574* (2013.01); *C23C 16/48* (2013.01)

(58) Field of Classification Search
CPC ..... C23C 14/243; C23C 14/225; C23C 16/44; C23C 16/30; C23C 16/00; C23C 16/45563
See application file for complete search history.

(56) References Cited

U.S. PATENT DOCUMENTS

| | | | | |
|---|---|---|---|---|
| 5,851,294 | A * | 12/1998 | Young | C23C 16/45563 118/715 |
| 6,070,551 | A * | 6/2000 | Li | C23C 16/401 |
| 6,143,078 | A * | 11/2000 | Ishikawa | H01L 21/67017 118/715 |
| 6,206,972 | B1 * | 3/2001 | Dunham | H01J 37/3244 118/715 |
| 6,251,187 | B1 * | 6/2001 | Li | C23C 16/4405 118/715 |
| 6,263,522 | B1 * | 7/2001 | Dongo | A61H 33/027 239/281 |
| 6,436,193 | B1 * | 8/2002 | Kasai | C23C 16/455 118/715 |
| 7,976,671 | B2 * | 7/2011 | Chandrachood | H01J 37/321 156/345.33 |
| 8,298,338 | B2 * | 10/2012 | Kim | C23C 16/45591 118/715 |
| 8,372,200 | B2 * | 2/2013 | Okesaku | H01J 37/3244 118/715 |
| 8,440,049 | B2 * | 5/2013 | Zhou | H01J 37/32477 156/345.34 |
| 8,852,344 | B2 * | 10/2014 | Benvenuti | C23C 14/243 118/715 |
| 10,400,334 | B2 * | 9/2019 | Benvenuti | C23C 16/00 |
| 10,988,842 | B2 * | 4/2021 | Modtland | C23C 16/305 |
| 2007/0095286 | A1 * | 5/2007 | Baek | C23C 16/4412 118/719 |
| 2007/0181531 | A1 * | 8/2007 | Horiguchi | C23C 16/24 216/67 |
| 2009/0013930 | A1 * | 1/2009 | Reinhold | C23C 16/45565 118/715 |
| 2009/0178616 | A1 * | 7/2009 | Byun | C23C 16/45574 118/715 |
| 2009/0304924 | A1 * | 12/2009 | Gadgil | C23C 16/45551 427/255.5 |
| 2011/0239940 | A1 * | 10/2011 | Benvenuti | C23C 16/30 118/715 |
| 2013/0149470 | A1 * | 6/2013 | Fischer | C23C 14/28 427/596 |
| 2017/0096736 | A1 * | 4/2017 | Benvenuti | C23C 16/4558 |
| 2019/0330735 | A1 * | 10/2019 | Modtland | C30B 29/48 |
| 2020/0010955 | A1 * | 1/2020 | Benvenuti | C23C 16/45565 |

* cited by examiner

Fig. 1
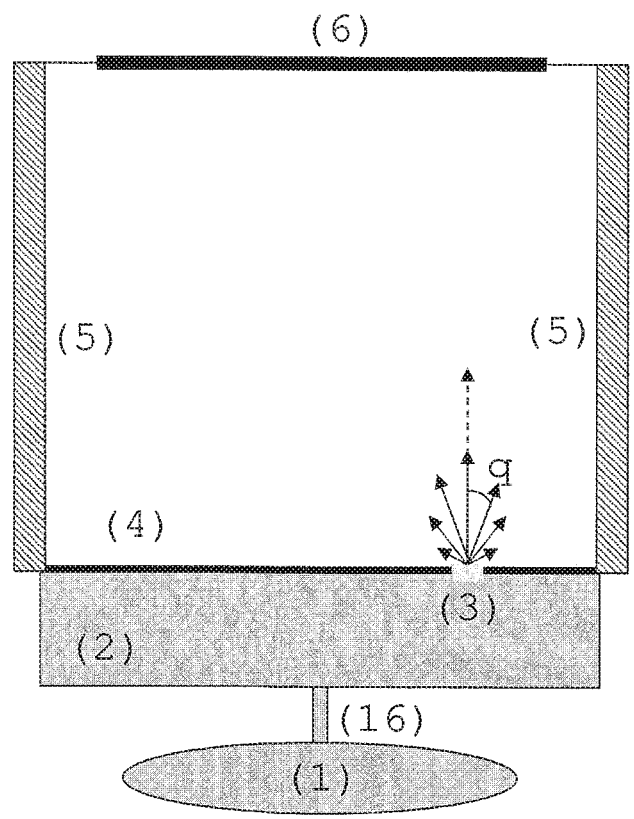
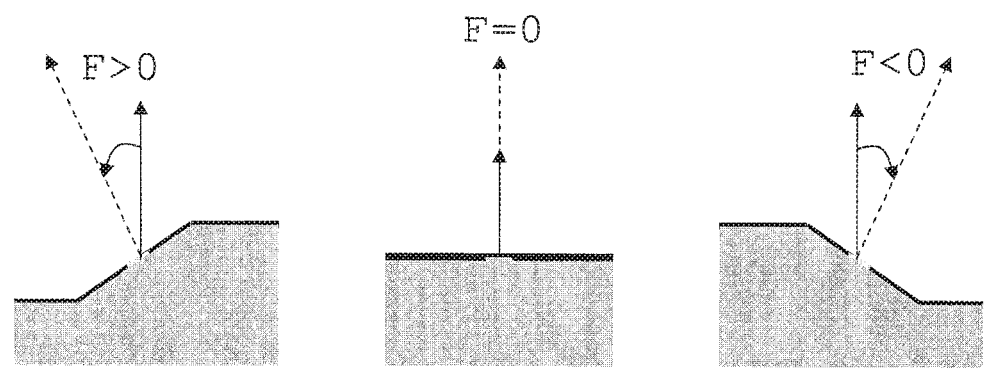
--Prior Art--

--Prior Art--

(a)

(b)

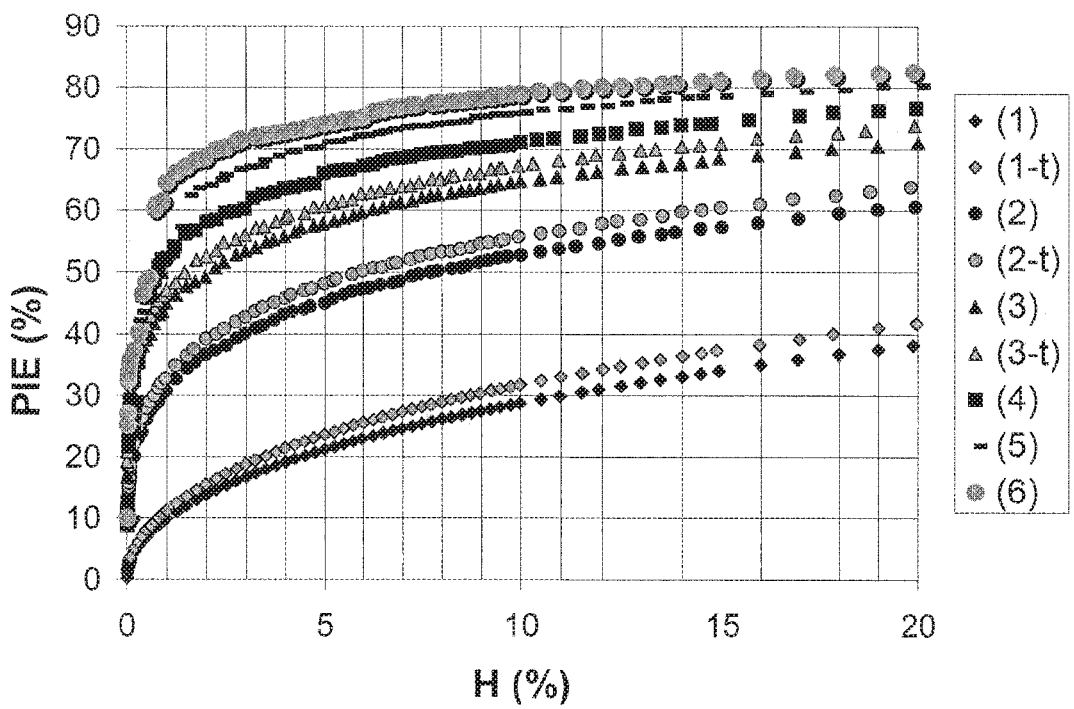
*Figure 4-* Interesting results PIE vs H obtained with multi-ring of sources.
Optimization of the multi-ring system has been carried out, and some interesting results are presented here, for respectively 1 ring (1), 1 ring of tilted sources (1-t), 2 rings (2), 2 rings of tilted sources (2-t), 3 rings (3), 3 rings of tilted sources (3-t), 4 rings (4), 5 rings (5) and 6 rings (6).

Fig. 4A

One ring

| h | R1 | Φ1 | f1norm |
|---|---|---|---|
| 179.2 | 135.6 | 0 | 1 |
| 148.7 | 115.7 | 0 | 1 |
| 133.0 | 105.7 | 0 | 1 |
| 122.6 | 99.2 | 0 | 1 |
| 115.0 | 94.5 | 0 | 1 |
| 109.4 | 91.1 | 0 | 1 |
| 104.5 | 88.2 | 0 | 1 |
| 100.4 | 85.8 | 0 | 1 |
| 96.9 | 83.7 | 0 | 1 |
| 94.0 | 82.0 | 0 | 1 |
| 89.1 | 79.2 | 0 | 1 |
| 84.9 | 76.9 | 0 | 1 |
| 81.5 | 75.0 | 0 | 1 |
| 78.6 | 73.4 | 0 | 1 |
| 76.1 | 72.1 | 0 | 1 |
| 70.9 | 69.3 | 0 | 1 |
| 66.9 | 67.3 | 0 | 1 |
| 63.0 | 65.3 | 0 | 1 |
| 60.8 | 64.3 | 0 | 1 |
| 158.0 | 154.4 | 32 | 1 |
| 130.3 | 132.9 | 34 | 1 |
| 120.4 | 117.6 | 25 | 1 |
| 109.5 | 112.1 | 29 | 1 |
| 102.3 | 107.2 | 30 | 1 |
| 97.1 | 103.2 | 30 | 1 |
| 93.7 | 98.8 | 27 | 1 |
| 88.7 | 97.5 | 31 | 1 |
| 86.1 | 95.0 | 30 | 1 |
| 83.5 | 93.0 | 30 | 1 |
| 79.1 | 89.4 | 29 | 1 |
| 76.0 | 86.2 | 27 | 1 |
| 72.7 | 84.5 | 28 | 1 |
| 70.4 | 82.4 | 27 | 1 |
| 68.0 | 80.9 | 27 | 1 |
| 62.9 | 78.5 | 29 | 1 |
| 59.8 | 75.7 | 27 | 1 |
| 56.1 | 73.9 | 28 | 1 |
| 54.2 | 72.4 | 27 | 1 |

Fig 4A (continued)

Two rings

| h | R1 | Φ1 | f1norm | R2 | Φ2 | f2norm |
|---|---|---|---|---|---|---|
| 62.8 | 92.0 | 0 | 69 | 34.7 | 0 | 14 |
| 55.4 | 86.2 | 0 | 69 | 33.2 | 0 | 15 |
| 50.3 | 82.6 | 0 | 74 | 32.1 | 0 | 17 |
| 47.7 | 80.7 | 0 | 72 | 31.5 | 0 | 17 |
| 46.1 | 79.3 | 0 | 72 | 30.8 | 0 | 17 |
| 44.0 | 78.0 | 0 | 69 | 30.8 | 0 | 17 |
| 42.7 | 77.1 | 0 | 68 | 30.4 | 0 | 17 |
| 40.8 | 76.1 | 0 | 66 | 30.2 | 0 | 17 |
| 40.2 | 75.5 | 0 | 66 | 30.0 | 0 | 17 |
| 39.4 | 74.8 | 0 | 74 | 29.4 | 0 | 19 |
| 37.1 | 73.8 | 0 | 74 | 29.5 | 0 | 20 |
| 36.0 | 73.3 | 0 | 75 | 29.5 | 0 | 21 |
| 34.7 | 72.3 | 0 | 75 | 29.0 | 0 | 21 |
| 33.7 | 71.6 | 0 | 74 | 28.8 | 0 | 21 |
| 32.8 | 71.1 | 0 | 73 | 28.6 | 0 | 21 |
| 30.9 | 70.1 | 0 | 88 | 28.2 | 0 | 26 |
| 29.6 | 69.3 | 0 | 83 | 28.1 | 0 | 25 |
| 28.7 | 68.8 | 0 | 65 | 28.0 | 0 | 20 |
| 27.3 | 68.1 | 0 | 65 | 27.3 | 0 | 20 |
| 57.4 | 97.7 | 28 | 78 | 43.2 | 44 | 12 |
| 51.6 | 88.9 | 17 | 69 | 40.7 | 41 | 13 |
| 47.2 | 88.6 | 28.5 | 115 | 35.8 | 21 | 19 |
| 44.3 | 85.8 | 27.5 | 110 | 34.9 | 22 | 19 |
| 42.8 | 84.5 | 27.5 | 112 | 34.6 | 21 | 20 |
| 41.6 | 81.2 | 18 | 126 | 34.4 | 20 | 26 |
| 40.0 | 80.4 | 19 | 125 | 33.8 | 20 | 26 |
| 38.4 | 80.2 | 22.5 | 87 | 33.8 | 21 | 18 |
| 37.3 | 79.4 | 22.5 | 90 | 33.6 | 21 | 19 |
| 36.6 | 78.8 | 23.5 | 91 | 33.0 | 20 | 19 |
| 34.8 | 77.6 | 23 | 119 | 32.9 | 21 | 26 |
| 33.7 | 77.0 | 24 | 121 | 33.1 | 22 | 27 |
| 32.5 | 75.8 | 22 | 120 | 32.8 | 22 | 28 |
| 31.5 | 75.4 | 23 | 123 | 32.4 | 21 | 29 |
| 30.4 | 74.7 | 22 | 118 | 32.8 | 24 | 29 |
| 28.7 | 74.1 | 25 | 128 | 31.1 | 18 | 31 |
| 27.2 | 73.5 | 27 | 126 | 30.9 | 18 | 31 |
| 26.4 | 72.3 | 24 | 124 | 30.4 | 16 | 32 |
| 25.7 | 71.1 | 19 | 116 | 29.8 | 13 | 32 |

Fig. 4A (continued)

Three rings

| h | R1 | Φ1 | f1norm | R2 | Φ2 | f2norm | R3 | Φ3 | f3norm |
|---|---|---|---|---|---|---|---|---|---|
| 39.5 | 47.9 | 0 | 49 | 84.5 | 0 | 155 | 19.7 | 0 | 17 |
| 33.7 | 47.6 | 0 | 77 | 80.8 | 0 | 216 | 20.0 | 0 | 29 |
| 31.8 | 46.6 | 0 | 80 | 79.0 | 0 | 220 | 19.6 | 0 | 30 |
| 31.0 | 45.6 | 0 | 81 | 78.0 | 0 | 221 | 19.0 | 0 | 29 |
| 29.1 | 45.6 | 0 | 78 | 77.0 | 0 | 201 | 18.8 | 0 | 28 |
| 27.8 | 45.5 | 0 | 79 | 76.1 | 0 | 201 | 19.0 | 0 | 30 |
| 26.8 | 45.1 | 0 | 82 | 75.5 | 0 | 202 | 18.6 | 0 | 30 |
| 26.3 | 44.8 | 0 | 81 | 75.1 | 0 | 197 | 18.3 | 0 | 29 |
| 25.4 | 45.1 | 0 | 80 | 74.7 | 0 | 190 | 18.6 | 0 | 30 |
| 25.0 | 44.5 | 0 | 81 | 74.3 | 0 | 191 | 18.2 | 0 | 29 |
| 23.9 | 44.5 | 0 | 82 | 73.7 | 0 | 188 | 18.2 | 0 | 30 |
| 22.8 | 44.6 | 0 | 84 | 73.2 | 0 | 188 | 18.5 | 0 | 32 |
| 22.1 | 44.5 | 0 | 87 | 72.7 | 0 | 191 | 18.4 | 0 | 33 |
| 21.6 | 44.1 | 0 | 88 | 72.3 | 0 | 192 | 18.1 | 0 | 33 |
| 21.0 | 44.2 | 0 | 83 | 72.0 | 0 | 179 | 18.3 | 0 | 32 |
| 19.7 | 44.0 | 0 | 86 | 71.4 | 0 | 179 | 18.2 | 0 | 33 |
| 18.9 | 43.8 | 0 | 92 | 71.0 | 0 | 186 | 18.0 | 0 | 35 |
| 18.0 | 43.4 | 0 | 93 | 70.5 | 0 | 186 | 17.7 | 0 | 35 |
| 17.6 | 43.1 | 0 | 90 | 70.119 | 0 | 181 | 17.7 | 0 | 34 |
| 37.7 | 87.4 | 18 | 145 | 22.2 | 11 | 15 | 48.6 | 2 | 39 |
| 32.9 | 83.7 | 19 | 144 | 21.6 | 11 | 17 | 47.6 | 1 | 43 |
| 30.8 | 82.2 | 21 | 147 | 20.6 | 11 | 17 | 46.7 | 2 | 45 |
| 29.1 | 80.5 | 20 | 148 | 20.1 | 8 | 18 | 46.0 | 2 | 47 |
| 27.4 | 80.1 | 25 | 142 | 20.2 | 8 | 18 | 45.7 | 1 | 45 |
| 26.4 | 79.6 | 25 | 141 | 20.0 | 8 | 18 | 45.7 | 2 | 46 |
| 26.0 | 78.5 | 23 | 142 | 20.0 | 7 | 19 | 45.1 | 1 | 47 |
| 25.1 | 78.1 | 25 | 146 | 19.8 | 10 | 18 | 45.8 | 9 | 48 |
| 24.7 | 77.6 | 24 | 147 | 19.5 | 10 | 18 | 45.4 | 9 | 49 |
| 24.0 | 76.7 | 20 | 139 | 19.7 | 5 | 19 | 47.3 | 15 | 50 |
| 22.7 | 76.4 | 23 | 143 | 19.2 | 5 | 21 | 44.8 | 2 | 53 |
| 22.2 | 75.8 | 23 | 142 | 18.9 | 4 | 21 | 44.6 | 2 | 53 |
| 21.4 | 74.6 | 16 | 142 | 19.5 | 8 | 21 | 46.4 | 14 | 58 |
| 21.1 | 75.0 | 24 | 142 | 19.4 | 7 | 21 | 44.2 | 5 | 53 |
| 20.2 | 74.7 | 24 | 141 | 19.4 | 11 | 22 | 44.0 | 1 | 56 |
| 19.3 | 73.5 | 20 | 145 | 18.4 | 5 | 23 | 43.7 | 3 | 60 |
| 18.5 | 73.2 | 22 | 139 | 19.1 | 9 | 23 | 43.0 | 0 | 58 |
| 17.5 | 73.0 | 24 | 142 | 18.8 | 6 | 23 | 45.6 | 13 | 61 |
| 16.9 | 72.6 | 24 | 142 | 18.6 | 6 | 23 | 45.0 | 13 | 61 |

Fig. 4A (continued)

4 and 5 rings

| h | R1 | Φ1 | f1norm | R2 | Φ2 | f2norm | R3 | Φ3 | f3norm | R4 | f4norm |
|---|---|---|---|---|---|---|---|---|---|---|---|
| 29.6 | 82.5 | 0 | 119 | 56.2 | 0 | 44 | 14.7 | 0 | 10 | 35.0 | 26 |
| 26.3 | 79.5 | 0 | 124 | 54.6 | 0 | 48 | 14.9 | 0 | 12 | 34.9 | 29 |
| 23.3 | 78.1 | 0 | 115 | 54.4 | 0 | 51 | 13.7 | 0 | 11 | 33.6 | 30 |
| 22.6 | 76.9 | 0 | 115 | 53.4 | 0 | 50 | 13.5 | 0 | 11 | 33.1 | 30 |
| 21.8 | 76.3 | 0 | 115 | 53.9 | 0 | 49 | 14.5 | 0 | 13 | 34.5 | 32 |
| 21.6 | 75.9 | 0 | 115 | 53.4 | 0 | 49 | 14.5 | 0 | 13 | 34.6 | 32 |
| 20.0 | 75.2 | 0 | 113 | 52.8 | 0 | 53 | 14.2 | 0 | 13 | 33.3 | 31 |
| 19.7 | 74.9 | 0 | 113 | 52.3 | 0 | 53 | 14.2 | 0 | 13 | 33.2 | 31 |
| 19.5 | 74.5 | 0 | 113 | 52.0 | 0 | 53 | 14.0 | 0 | 13 | 33.1 | 31 |
| 18.1 | 74.4 | 0 | 113 | 53.5 | 0 | 58 | 14.0 | 0 | 14 | 33.5 | 36 |
| 17.5 | 74.2 | 0 | 111 | 53.3 | 0 | 59 | 13.9 | 0 | 14 | 33.3 | 36 |
| 17.0 | 73.5 | 0 | 110 | 52.0 | 0 | 58 | 13.4 | 0 | 13 | 32.1 | 34 |
| 16.7 | 73.2 | 0 | 111 | 51.7 | 0 | 59 | 13.3 | 0 | 13 | 31.6 | 34 |
| 16.3 | 72.8 | 0 | 110 | 51.4 | 0 | 59 | 13.4 | 0 | 13 | 31.5 | 33 |
| 15.8 | 72.7 | 0 | 102 | 51.5 | 0 | 56 | 12.6 | 0 | 11 | 31.3 | 33 |
| 15.3 | 72.1 | 0 | 101 | 51.1 | 0 | 56 | 12.3 | 0 | 11 | 31.1 | 33 |
| 14.5 | 71.8 | 0 | 104 | 51.0 | 0 | 59 | 12.5 | 0 | 12 | 31.1 | 35 |
| 13.6 | 71.4 | 0 | 103 | 50.9 | 0 | 60 | 12.4 | 0 | 13 | 31.4 | 35 |
| 13.4 | 71.2 | 0 | 101 | 51.0 | 0 | 59 | 12.4 | 0 | 12 | 31.4 | 36 |

| h | R1 | Φ1 | f1norm | R2 | Φ2 | f2norm | R3 | Φ3 | f3norm | R4 | f4norm | R5 | f5norm |
|---|---|---|---|---|---|---|---|---|---|---|---|---|---|
| 30.0 | 84.7 | 0 | 88 | 72.4 | 0 | 24 | 52.8 | 0 | 35 | 32.0 | 19 | 13.4 | 7 |
| 24.9 | 81.2 | 0 | 87 | 66.6 | 0 | 24 | 50.8 | 0 | 34 | 31.0 | 21 | 12.2 | 7 |
| 18.6 | 77.3 | 0 | 92 | 58.9 | 0 | 43 | 42.8 | 0 | 31 | 26.5 | 19 | 10.8 | 7 |
| 17.8 | 76.6 | 0 | 92 | 58.5 | 0 | 44 | 42.2 | 0 | 32 | 26.1 | 19 | 10.8 | 7 |
| 17.1 | 75.9 | 0 | 86 | 57.5 | 0 | 43 | 41.5 | 0 | 28 | 26.3 | 18 | 10.8 | 7 |
| 16.5 | 75.4 | 0 | 83 | 57.1 | 0 | 42 | 41.6 | 0 | 27 | 26.3 | 18 | 11.0 | 7 |
| 15.6 | 75.0 | 0 | 87 | 57.7 | 0 | 46 | 41.4 | 0 | 33 | 25.3 | 19 | 10.4 | 7 |
| 15.3 | 74.8 | 0 | 84 | 57.1 | 0 | 45 | 41.0 | 0 | 31 | 25.3 | 18 | 10.4 | 7 |
| 15.1 | 74.5 | 0 | 83 | 56.9 | 0 | 45 | 40.8 | 0 | 30 | 25.4 | 18 | 10.4 | 7 |
| 14.6 | 74.4 | 0 | 88 | 57.0 | 0 | 49 | 40.8 | 0 | 34 | 24.9 | 20 | 9.8 | 7 |
| 14.1 | 74.0 | 0 | 88 | 57.1 | 0 | 49 | 41.1 | 0 | 35 | 25.0 | 21 | 10.0 | 7 |
| 13.5 | 73.7 | 0 | 87 | 56.7 | 0 | 50 | 40.7 | 0 | 35 | 24.7 | 21 | 9.5 | 7 |
| 13.3 | 73.4 | 0 | 86 | 56.4 | 0 | 49 | 40.3 | 0 | 35 | 24.4 | 20 | 9.9 | 7 |
| 12.7 | 73.3 | 0 | 88 | 56.5 | 0 | 52 | 40.8 | 0 | 36 | 25.1 | 22 | 10.1 | 8 |
| 12.5 | 73.0 | 0 | 88 | 56.3 | 0 | 52 | 40.5 | 0 | 36 | 24.9 | 22 | 10.0 | 8 |
| 12.0 | 72.6 | 0 | 86 | 56.0 | 0 | 51 | 40.6 | 0 | 36 | 24.9 | 22 | 10.0 | 8 |
| 11.4 | 72.4 | 0 | 87 | 56.2 | 0 | 53 | 40.5 | 0 | 38 | 24.7 | 23 | 9.9 | 8 |
| 11.1 | 72.0 | 0 | 84 | 55.3 | 0 | 51 | 40.3 | 0 | 36 | 24.5 | 22 | 9.9 | 8 |
| 11.0 | 71.8 | 0 | 84 | 55.0 | 0 | 52 | 39.9 | 0 | 36 | 24.5 | 22 | 9.8 | 8 |

Fig. 4A (continued)

6 rings

| h | R1 | Φ1 | f1no rm | R2 | Φ2 | f2no rm | R3 | Φ3 | f3no rm | R4 | f4no rm | R5 | f5no rm | R6 | f6no rm |
|---|---|---|---|---|---|---|---|---|---|---|---|---|---|---|---|
| 27.2 | 77.6 | 0 | 60 | 34.2 | 0 | 39 | 88.7 | 0 | 61 | 14.4 | 15 | 80.3 | 64 | 55.1 | 67 |
| 16.4 | 35.9 | 0 | 78 | 77.8 | 0 | 312 | 9.9 | 0 | 22 | 48.7 | 110 | 62.1 | 152 | 23.2 | 52 |
| 15.3 | 35.8 | 0 | 82 | 76.9 | 0 | 304 | 9.7 | 0 | 22 | 48.4 | 111 | 61.6 | 154 | 22.8 | 53 |
| 14.9 | 34.7 | 0 | 79 | 76.2 | 0 | 306 | 9.6 | 0 | 22 | 47.4 | 113 | 60.6 | 155 | 22.4 | 50 |
| 14.0 | 35.7 | 0 | 81 | 75.7 | 0 | 279 | 9.6 | 0 | 21 | 47.9 | 101 | 60.7 | 148 | 22.5 | 51 |
| 13.5 | 35.5 | 0 | 82 | 75.3 | 0 | 274 | 9.5 | 0 | 21 | 47.8 | 99 | 60.4 | 148 | 22.4 | 51 |
| 13.4 | 35.2 | 0 | 80 | 75.0 | 0 | 269 | 9.5 | 0 | 21 | 47.6 | 97 | 59.9 | 144 | 22.4 | 49 |
| 13.1 | 35.1 | 0 | 82 | 74.8 | 0 | 268 | 9.6 | 0 | 21 | 47.5 | 98 | 60.0 | 143 | 22.0 | 48 |
| 12.9 | 35.8 | 0 | 85 | 74.6 | 0 | 275 | 9.7 | 0 | 23 | 47.4 | 95 | 59.8 | 154 | 22.8 | 53 |
| 12.6 | 35.7 | 0 | 85 | 74.4 | 0 | 274 | 9.7 | 0 | 23 | 47.0 | 94 | 59.4 | 153 | 22.5 | 52 |
| 12.2 | 35.4 | 0 | 86 | 74.1 | 0 | 268 | 9.7 | 0 | 23 | 47.2 | 91 | 59.3 | 154 | 22.5 | 51 |
| 11.4 | 35.1 | 0 | 87 | 73.8 | 0 | 269 | 9.4 | 0 | 23 | 47.0 | 108 | 59.6 | 160 | 22.3 | 56 |
| 11.1 | 35.0 | 0 | 87 | 73.6 | 0 | 269 | 9.3 | 0 | 23 | 46.8 | 108 | 59.4 | 160 | 22.1 | 56 |
| 10.9 | 34.9 | 0 | 87 | 73.5 | 0 | 262 | 9.4 | 0 | 23 | 46.7 | 107 | 59.2 | 158 | 22.0 | 54 |
| 10.5 | 34.5 | 0 | 89 | 73.3 | 0 | 258 | 9.3 | 0 | 23 | 46.9 | 110 | 59.3 | 156 | 21.9 | 52 |
| 10.1 | 34.1 | 0 | 90 | 73.0 | 0 | 254 | 9.3 | 0 | 23 | 47.0 | 112 | 59.4 | 156 | 21.9 | 52 |
| 9.8 | 34.7 | 0 | 93 | 72.7 | 0 | 261 | 8.9 | 0 | 23 | 46.6 | 107 | 58.7 | 162 | 22.0 | 59 |
| 9.6 | 35.5 | 0 | 93 | 72.4 | 0 | 260 | 9.0 | 0 | 23 | 46.5 | 108 | 58.2 | 163 | 22.1 | 60 |
| 9.4 | 35.6 | 0 | 94 | 72.3 | 0 | 259 | 9.0 | 0 | 23 | 46.4 | 107 | 58.0 | 162 | 22.0 | 59 |

*Table 1* - Example of interesting configurations calculated for $r_{sub}=75$.
The configurations presented here are interesting configurations to be used with the multi-ring system, in term of PIE obtained for a given h.

Fig. 4B

| h/R | 10 | 20 | 30 | 40 | 50 | 60 | 70 | 80 | 90 | 100 | 110 | 120 |
|---|---|---|---|---|---|---|---|---|---|---|---|---|
| 10 | 7 | 11 | 17 | 23 | 28 | 34 | 40 | 39 | 26 | 19 | 15 | 12 |
| 20 | 3 | 6 | 9 | 12 | 15 | 17 | 20 | 22 | 19 | 16 | 13 | 12 |
| 30 | 3 | 4 | 6 | 9 | 11 | 12 | 14 | 15 | 15 | 13 | 12 | 11 |
| 40 | 3 | 4 | 5 | 7 | 9 | 10 | 11 | 12 | 12 | 11 | 11 | 10 |
| 50 | 3 | 4 | 5 | 6 | 8 | 8 | 9 | 10 | 10 | 10 | 10 | 9 |
| 60 | 3 | 3 | 4 | 5 | 7 | 9 | 8 | 9 | 9 | 9 | 9 | 8 |
| 70 | 3 | 3 | 4 | 5 | 6 | 7 | 7 | 8 | 8 | 8 | 8 | 8 |
| 80 | 2 | 3 | 4 | 5 | 5 | 6 | 8 | 7 | 8 | 8 | 8 | 7 |
| 90 | 2 | 3 | 4 | 4 | 5 | 6 | 7 | 8 | 7 | 7 | 7 | 7 |
| 100 | 2 | 3 | 3 | 4 | 5 | 5 | 6 | 7 | 7 | 7 | 7 | 7 |
| 110 | 2 | 3 | 3 | 4 | 4 | 5 | 6 | 6 | 8 | 7 | 7 | 7 |
| 120 | 2 | 3 | 3 | 4 | 4 | 5 | 5 | 6 | 7 | 6 | 7 | 7 |
| 130 | 2 | 3 | 3 | 3 | 4 | 4 | 5 | 5 | 6 | 7 | 7 | 7 |
| 140 | 2 | 3 | 3 | 3 | 4 | 4 | 5 | 5 | 5 | 6 | 7 | 7 |
| 150 | 2 | 2 | 3 | 3 | 4 | 4 | 4 | 5 | 5 | 6 | 6 | 7 |

*Table 2*- Minimal number of sources to ensure angular homogeneity.
The homogeneity calculated from Figure 2 considers only the radial flow profile. With a limited number of sources, an angular inhomogeneity is added to the radial inhomogeneity. The present table presents as a function of R and h the minimum number of sources that should put on a ring such that the radial inhomogeneities increase of less than 5% the H value calculated from the flow described by Equation 2, for $r_{sub}=75$.

Fig. 5

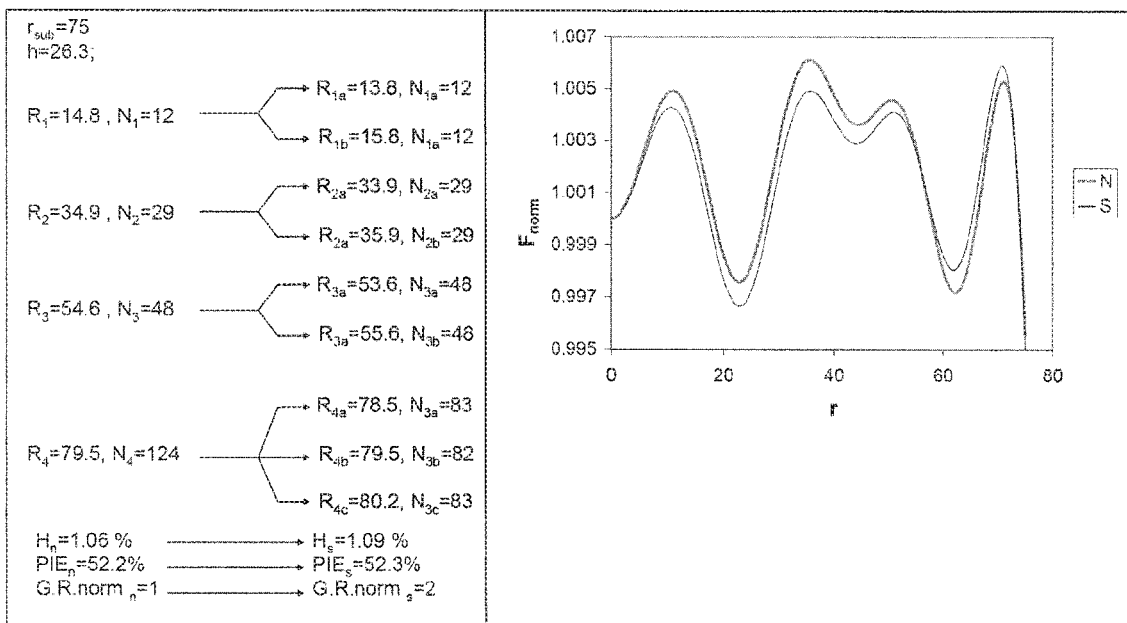

*Figure 5-* Example of ring splitting
An initial configuration found in Table 1 with 4 initial rings is split into 9 rings (see values on the left table). For clarity sake, we assume in this simple example that all the holes have the same area and flow.
The flow profile on the substrate (curve N) is almost non affected by the splitting (curve S), the homogeneity values Hn and PIE are also almost non affected (after splitting, Hs and PIEs), while the growth rate can be increased by a factor 2 (normalized value G.R.norm$_n$ becomes G.R.norm$_s$ ).

VAPOR PHASE DEPOSITION SYSTEM

This application is a divisional of U.S. application Ser. No. 15/263,275 filed Sep. 12, 2016, which is a continuation of U.S. application Ser. No. 13/123,225 filed on Apr. 7, 2011, which is the U.S. national phase of International Application No. PCT/IB2009/054421 filed Oct. 8, 2009, which designated the U.S., and claims priority to International Application No. PCT/IB2008/054129 filed Oct. 8, 2008, the entire contents of each of which are hereby incorporated by reference.

FIELD OF THE INVENTION

The invention relates to thin film vapor phase deposition systems operating under vacuum conditions.

STATE OF THE ART

Thin film deposition is today one of the most rapidly expanding fields as it is the path to miniaturization and to the development of new material properties that are the main bottle necks of our industrial productive model. Applications and devices in the field of microelectronics are among the most well known examples, but more and more applications based on the same principles are applied to others fields like integrated optics, optronics, separating membranes, catalytic surfaces, or bio-compatible and interacting surfaces just to mention only a few examples. For these fields, be them emerging or since long established, more and more complex materials are required to fulfill the specifications of the targeted devices. The possibility to tailor their properties through the control of the materials chemical composition and/or their structures at the micro or sub-micrometric level, and of the overall architecture of the devices is just at the childhood stage and the true amazing potential is still out of reach.

Chemical beam deposition techniques[42](Chemical Beam Epitaxy CBE, Metal-Organic molecular beam epitaxy MOMBE, and Gas Source Molecular Beam Epitaxy GSMBE) are a variety of vapour phase thin film deposition techniques. They result from the merging of MBE (Molecular Beam Epitaxy) and CVD (Chemical Vapor Deposition). These techniques take from MBE the line of sigh trajectories and the oriented beam nature of the effusing molecules in Ultra High Vacuum (UHV) and from CVD the precursor chemical decomposition process on the substrate.

These technique, developed in the 1980-1990 ies [27, 43], were concentrating at its origin mostly on III-V semiconductor thin films [15, 18, 29, 1, 25], and displayed several advantages of the parent techniques, including high thin film quality, large growth rate (several m per hour), high reproducibility, high deposit uniformity (few %), efficient use of precursor, and the possibility to deposit up to quaternary element films [1, 28, 24].

Several designs were proposed for multi-wafer systems [3, 28, 20, 24] and single wafer systems [14]. Generally, only few evaporative sources are used, and substrate rotation is necessary to achieve deposit uniformity. The advantage of the Chemical Beam Deposition technique is that the precursor molecules undergo line of sight trajectories from the effusive sources to the substrate, which enables easy calculations of the flow patterns on the substrate.

However, if the solution of multi-capillary gas sources (over-cosine flows) has been widely investigated [7, 23, 4, 13], little work has been done on the optimization of the sources, in terms of precursor flow homogeneity on the substrate and ratio of emitted precursor reaching the substrate out of some preliminary work [7, 33, 34, 23]. In alternative to capillary arrays, distributions of pinholes assimilated to ideal orifices and behaving as Knudsen sources (cosine effusion in all directions per solid angle [37]), or sub-cosine emitters [5, 6] have been proposed (see FIG. 1 (FIG. 1)). To ensure homogeneity of the flux of a single precursor on the substrate, an interesting configuration of the sources is to dispose identical pinholes on a ring (see FIG. 2 (FIG. 2)). This configuration, already found in literature [23], is equivalent in term of homogeneity or precursor use efficiency (if the number of sources N is sufficiently high) to rotating the substrate [10].

Concentric circles of ideal pinholes distributed on the top face of a pre-chamber, which averages the flow controlled only by the pre-chamber pressure measured by a single gauge, where substrate rotation is avoided, and with a central aperture to allow a path for beam particles have already been also proposed [5]. This patented set up was provided to achieve compatibility with particle beams irradiation during the growth. A schematic representation of the principle of the effusion sources according to Benvenuti [5] is presented in FIG. 1 (FIG. 1), and the basic geometry of the reactor is presented in FIG. 2 (FIG. 2).

The reactor of this invention may present a window which allows substrate irradiation with a beam, typically a laser beam or an electron beam. As the substrate is not rotated, direct writing or mask projection image can be easily realized to induce locally a variation in the growth of the film by particle beam irradiation. Alternatively, the whole substrate may be irradiated to induce homogeneously an advantage from the particle beam irradiation.

Basics mathematics formulae from which the precursor molecules impinging rate distribution on the substrate may be found or derived from the literature [17, 16, 4, 37, 11, 40, 41, 12]. An improved formula, we developed and used to calculate the surfacic flow from a single source to any point of the substrate is (according to the notations given in FIG. 2 (FIG. 2)):

$$\left(\text{If } \phi > 0 \text{ and } r \times \cos(\alpha_i - \beta) < R + \frac{h}{\tan\phi}\right) \text{ or} \quad \text{Equation 1}$$

$$\left(\text{If } \phi < 0 \text{ and } r \times \cos(\alpha_i - \beta) > R + \frac{h}{\tan\phi}\right)$$

$$F_{source} = \frac{I_o \times h}{\pi} \times \frac{(R \times \sin\Phi - r \times \sin\Phi \times \cos(\alpha_i - \beta) + h \times \cos\Phi)}{(R^2 + r^2 + h^2 - 2Rr \times \cos(\alpha_i - \beta))^2}$$

$$\text{otherwise } F_{source} = 0, \text{ where } I_o = \frac{(P_c - P_g)}{\sqrt{2\pi M R_g T}} \times A.$$

$I_o$ is the total flow emitted by a given pinhole: a typical value for $I_o$ ranges typically from $2 \times 10^{11}$ to $3 \times 10^{18}$ molecules/s ($10^{-7}$-10 sccm), M is the precursor molar mass, $R_g$ the rare gas constant, T the chamber temperature.

The total flow at any point of the substrate is calculated by summing the flow from each source. In this way, the precursor flow homogeneity on the substrate (i.e $$H = \frac{F_{max} - F_{min}}{F_{min}},$$

where $F_{max}$ and $F_{min}$ are respectively the maximum and minimum surface flux density obtained on the whole substrate) and the precursor impinging efficiency (i.e PIE, meaning ratio between the amount of precursor impinging without collisions onto the substrate and the total amount of precursor effusing from the sources) can be calculated and values of ring source radius and distance h may be optimized with respect to substrate radius $r_{sub}$. It should be noted that the model predicts that results are scalable with any substrate size, thus allowing fast up-scaling of the deposition system to whatever substrate sizes.

The best homogeneities are obtained for larger R and larger distances h of the sources to the substrate. Increasing R and h is, however, to the detriment of efficient use of the evaporated species and contributes to increasing size and cost of the system. Increasing the distance h also reduces the maximum resolution of patterns with a mask projection laser light assisted process and is poorly compatible with the optics of charged particle beams. With a single precursor source ring and normal effusion ($\Phi$=0), to achieve thickness homogeneity of 1%, the best achievable PIE is about 10% and is comparable to what is achieved with most techniques. The solution corresponding to the point 1% homogeneity was experimentally tested for a 6 inch wafer with $TiO_2$ deposition from titanium tetra-isopropoxide[6]. The slight discrepancy observed between the model and the experiments was associated with pressure gradients in the pre-chamber. As only one pressure gauge in the pre-chamber is used to control the effusive flows of the whole ring of sources, it is of utmost importance that the pressure below each source, determining the flow for that source, is well controlled, reproducible, and ideally identical for all sources associated with a given pressure gauge.

BRIEF DESCRIPTION OF THE DRAWINGS

FIG. 1—Principle of the precursor effusion from the source to the substrate.

FIG. 3 (FIG. 3A, 3B. 3C)—Homogenizing ring between precursor reservoir and pre-chamber.

FIG. 4—Interesting results PIE vs H obtained with multi-ring of sources.

FIG. 4A—Table 1—Example of interesting configurations calculated for $r_{sub}$=75.

FIG. 4B—Table 2—Minimal number of sources to ensure angular homogeneity.

FIG. 5—Example of ring splitting

FIG. 6 (FIG. 6A, 6B, 6C)—Principle of pre-chamber quarters for each precursor

FIG. 7 (FIG. 7A, 7B)—Example of thickness graded deposit using a single precursor.

DESCRIPTION OF THE INVENTION

Figure 2:
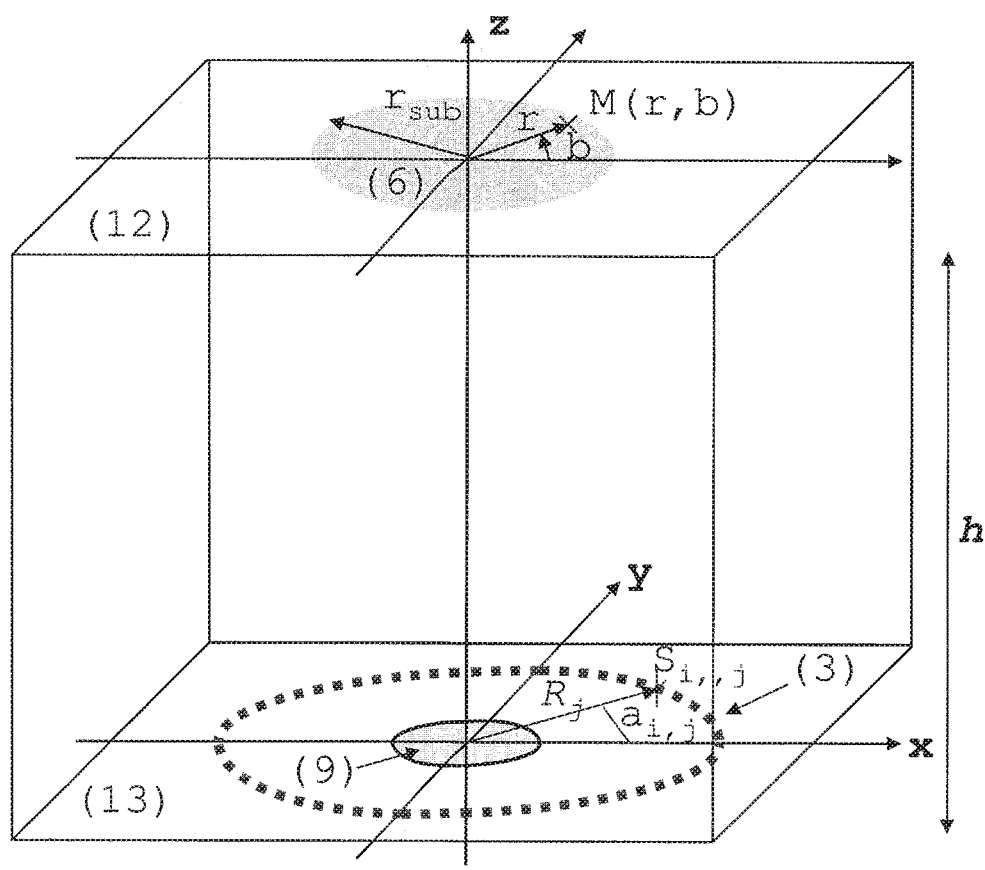
FIG. 2—Basic geometry of the reactor.

The purpose of the disclosed invention is to provide flexible thin film deposition equipment for R&D investigation and production, simultaneously possessing a high degree of control on the deposition process suitable for prototyping up to mass production.

Several objectives are contemplated in the present invention, in particular:

Achieve a flexible equipment enabling thin film (substrate) deposition/etching in a controlled and reproducible manner of binary or ternary thin films (i.e. 2 and 3 elements respectively) or more complex materials/thin films (1 or more elements with gradients and/or with tailored patterns and/or with 3D embedded structures) with a vapor phase deposition technique eventually assisted by beams of particles (photons, electrons, activated atoms, ions, reactive molecules, chemically or physically hindering molecules).

The topics this equipment wants to address are:
1. Direct patterning during the growth of (preferably, but not limited to) chemically inert materials that are difficult to etch in a second step process or to bypass the problematic of conformal thin film deposition of patterned surfaces.
2. Reduce or avoid problems related to thermal stress by enhancing/assisting the process with one or more beams of particles (including but not limited to photons, electrons, ions, energetic atoms, and/or reactive chemical species).
3. Reduce or avoid problems related to inter-diffusion of species due to high temperature processes required to achieve either thin film growth or specific properties (specific crystalline phase, . . . ).
4. Investigate new multi-element materials in the form of thin films. The possibility to achieve growth conditions out of the thermodynamic equilibrium by mass transport limited regimes control and by particle beam assisted or induced deposition that allows a totally different approach to thin film deposition. In particular, we target the possibility to achieve composite materials with element segregation at the nanometer-micrometer scales and the possibility to obtain simultaneously on the same deposition process/layer combinations of phases and properties that are normally exclusive of each other.

Several barriers have to be overcome to achieve this aim and we can quote among others the followings:
1. Control molecular species and particle beams interactions with each other, preferably by controlling their impinging rate distributions on the substrate and possibly reducing or totally avoiding gas phase molecular/particle interactions that generally lead to poorly predictable and controllable effects.
2. Achieve high uniformity in precursors or beam particles impinging rates to obtain high thickness uniformity, high chemical composition uniformity, and more generally high uniformity in material properties.
3. Modify in an accurate and predictable manner the impinging rate distributions of the precursors or particle beams to achieve gradients or local patterning of thickness, chemical composition, or more generally material properties. Ad-hoc patterned surfaces may be used to improve or deeply modify such effects, in particular to have short scale-variations of flow ratios. In particular tailored hindering chemical precursor flows may be used to avoid deposition on surfaces with given orientation allowing larger selective flows of a given species.
4. Possibility of fast switching of the equipment from one configuration to another (time selectivity during a process) alternating different configurations during the growth (x,y,z directions) or simply to achieve within the same equipment flexible research and controlled production granting a fast transfer of R&D results to production.
5. Decrease the distance of the sources to the substrate both to optimize precursor use, thus also reducing by-products formation, improving patterning resolution with particle beams, and to decrease overall size and costs of the system.
6. Add particle beams compatible with previous set-ups to in-situ modify/pattern growth rates, crystalline phase, morphology, or more generally material properties or architectures. The beams should preferentially interact with the molecules contributing to the film growth on the substrate surface and interactions with species in the gas phase should be avoided. Ad-hoc patterned surfaces may be used to improve or deeply modify such effects, in particular to have short scale-modification of flow ratios. In particular tailored hindering chemical precursor flows may be used to avoid deposition in surfaces with given orientation allowing larger selective flows of a given species.
7. Deposition of 3D embedded structures in a single step avoiding second step patterning and successive conformal deposition of successive layers.

The above cited objectives are reached with the approaches presented below.

The system is designed such that:
1. Gas phase reactions are avoided: the different chemical precursors (for the different chemical element(s) to be deposited) are emitted from distinct pre-chambers into the growth chamber with line-of-sight trajectories toward the substrate. A specially designed cryo-panel ensures that the effused precursor molecules may only be emitted by the gas sources or be backscattered by the substrate.
2. The precursor effusion sources of the pre-chamber(s) are designed and disposed such that tailored precursor flows are obtained on the substrate surface, optimizing deposit uniformity and precursor use or generating thin films with complex chemical composition variations/gradients.
3. An optical set up, or an other particle beam shaping set-up, may be added to the system to allow beam irradiation of the substrate, either locally (by mask imaging projection or laser, electron, or ion writing) to generate local patterning or uniformly on the entire substrate (to enhance the growth or modify deposit properties).
4. One of the pre-chamber sets may be used for species not containing elements incorporated into the thin film to enhance, hinder, or assist the growth of the precursors constituting elements, in particular to reduce (increase) the main precursor decomposition temperatures, modify the element incorporation growth, modify the morphology or the crystalline phase, and reduce contamination. Ad-hoc patterned surfaces may be used to improve or deeply modify such effects, in particular to have short scale-modification of flow ratios. In particular tailored hindering chemical precursor flows may be used to avoid deposition on surfaces with given orientation allowing larger selective flows of a given species.
5. In alternative or in complement, a beam of particles may achieve the same effects.
6. The effusion sources are equipped with shutters, which enable to stop abruptly the effusion of chemical precursors. These shutters are compatible with particle beam irradiation and may also pulse chemical precursors beams and achieve temporal controlled distributions. The shutters also allow temporal modulation of intensity and/or distribution and are build in such a way that they are cooled to avoid, or at least reduced as much as possible, direct reemission of the molecules from their surface directly on the substrate or to the pre-chamber surface.
7. In-situ monitoring devices, also those requiring Ultra High Vacuum (UHV) conditions, to measure during the growth thin film variations of material(s) properties, and/or structure, and/or crystalline phase, and/or morphology, by scanning the deposition area, may be installed thanks to a main central aperture or several apertures in the effusive source.

More precisely the invention concerns a showerhead for vacuum deposition as defined in the claims.

The text below discusses some embodiments of the present invention.

Pressure Uniformity in the Pre-Chamber and Uniform Impinging Rates on the Substrate One aspect of the present invention consists in improving the species impinging rate uniformity on the substrate by avoiding pressure gradients in the pre-chamber. In this context the pre-chamber previously described [5] may advantageously be split into two parts (see FIG. 3a (FIG. 3A) and FIG. 3b (FIG. 3B) and FIG. 14 (FIG. 14) for the details): the pre-chamber with the effusing holes as previously described and a homogenizer ring before the pre-chamber to improve the pressure uniformity of the gas species before the sources (i.e. effusion holes). Said ring is connected to the pre-chamber(s) through a series of apertures evenly distributed either below the quarters or laterally. The conductance of the homogenizer ring (pipe section) should be larger than the conductance of the full set of the pre-chamber apertures to obtain a homogeneous pressure inside the ring and avoid pressure gradients due to the apertures gas induced depletion. A ratio of 10, or even 100, between the homogenizer ring conductance and the apertures conductance to the pre-chamber should be preferred. The conductance of the pre-chamber apertures should further be larger than the conductance resulting from the sum of the effusive holes conductance for a whole pre-chamber to avoid introducing a pressure drop between the homogenizer ring and the pre-chamber(s). A ratio of 10, or even 100, between the homogenizer ring conductance and the valves conductance should be preferred. This design is independent of the number of rings on which are distributed the sources in the pre-chamber. Finally, the conductance of the tubes leading to the homogenizer ring should be larger than the conductance of the homogenizer ring. A ratio of 10, or even 100, between the homogenizer ring conductance and the valves conductance should be preferred. A schematic figure is reported in FIG. 3 (FIG. 3C).

Designs with Several Rings for 1 Molecular Species to Reduce Equipment Size, Improve Precursor Efficient Use, Reduce by-Products Generation, and Improve Resolution for Mask Projection Patterning.

Another aspect of the present invention is to improve the results obtained with only 1 ring of effusive holes with several rings of sources. The possibility to dispose the sources on several concentric circles was proposed [5], but neither full mathematical modelling nor calculations were realized previous to our work to identify the most attractive configurations. The developed methodology enables to identify system parameters (h, different ring radii $R_i$, and for each source ring, total ring flow factor $f_i = N_i \times A_i$ where $A_i$ is a pinhole area, $N_i$ the number of pinholes per ring, and $\Phi_{is}$ the source tilt) that maximises the precursor efficiency use for any flow homogeneity. Equation 2 was derived to carry out the optimisation: it enables to calculate the total flow of a $N_{ring}$ multi-ring system at any position of the substrate, assuming a large number of sources on each ring:

$$F(r) = \frac{h \times (P_c - P_g)}{\pi \times \sqrt{2\pi M R_g T}} \times$$

$$\sum_{j=1}^{N_{ring}} f_j \times \frac{h \times \cos\Phi_j \times (h^2 + R_j^2 + r^2) + R_j \times \sin\Phi_j \times (h^2 + R_j^2 - r^2)}{(h^4 + R_j^4 + r^4 + 2h^2 R_j^2 + 2h^2 r^2 - 2R_j^2 r^2)^{3/2}}$$

(valid when $F$ is such that no shadowing effect takes place)

With the use of Equation 2, flow distributions could be calculated for any configuration, and H and PIE estimated from these distributions. Optimization of the system parameters (all $R_i$, $f_i$ and h) was carried out such that best PIE are obtained for a given homogeneity H. From the $f_i$, the number of sources $N_i$ per ring sufficient to fulfill the angular homogeneity and the surfaces of the pinholes $A_i$ to valid the point source approximation are extracted. FIG. 4 (FIG. 4) presents some results we obtained in terms of H and PIE for different number of rings. The disclosed improvement in comparison to Benvenuti's patent [5] is to provide full mathematical modeling and specific optimized configurations based on multi-rings design with cosine sources where homogeneity, reactor size, and precursor efficient use are optimized. In Table 1 (FIG. 4A), are reported some configuration families of interest calculated for a substrate of $r_{sub}$=75 mm (but as mentioned earlier, the solutions are scalable to any $r_{sub}$). The factors $f_{inorm}$ are normalized factors which should correspond to the flow ratios from the different rings. The flux of a ring should be distributed in $N_i$ sources with corresponding $A_i$ such that $N_i$ is sufficient not to induce large angular inhomogeneity. Table 2 (FIG. 4B) presents the minimal number of sources N as a function of R and h such that the radial inhomogeneity does not increase H of more than an additional 5% of the radial homogeneity calculated from Equation 2.

The list of configurations presented in Table 1 is of course not exhaustive, and in particular, slightly displacing the sources from the indicated positions reported in Table 1 will not modify the impinging rates distributions to a large extent. Thus close solutions should be regarded as belonging to the same family of disclosed solutions, especially any solutions where h, $R_i$, $f_i$ are varied of less than 10% and $\Phi_i$ of less than 10°, as well as all the solutions for which the effusing flow from a given ring varies by less than 10% and the holes could be distributed unevenly on a ring.

More generally, we intend here to protect any similar configurations that provides H better than 25% and PIE of at least 5%, with h smaller than $3 \times r_{sub}$, and the bigger ring $R_i$ smaller than 2 $r_{sub}$.

We also claim the possibility of ring splitting into several rings very close in radius. The radii of the new rings should be very close to the radius of the parent ring to conserve the uniformity (within a variation of 10% of the parent ring radius), but the distance of holes from different rings should also preferably be larger than the mean free path of the molecules in the pre-chamber to avoid depletion effects of one hole on the other. One of the main improvements of this ring splitting will be to increase gas effusion rates and thus growth rates. One or all the rings of a given configuration may be split, different radius split values can be applied to different ring splitting, a ring can be split into an even or an odd number of rings, the difference in radius from the initial ring may be different for all the split rings and the number of sources may be slightly different between different split rings originated from the same initial ring. An example of ring splitting is described in FIG. 5 (FIG. 5).

Concerning the growth rate, it should be noted that it is both linked to model parameters (i.e Io, number of sources and PIE) and to the chemical reactivity at the precursor (conversion rate of precursor reaching the substrate). The PIE is given by the system geometry chosen, the conversion rate is linked to the precursors, so to increase further the growth rate, we can either increase Io (increasing the precursor temperature reservoir) or increase the number of sources (for instance, by splitting the ring sources) or the source surface or all of them. With many precursors, this latest solution is by far the best for compounds difficult to vaporize or exhibiting a low stability with increasing temperature.

The present invention also plays with the hole sizes $A_i$ and/or on the number of holes $N_i$ to achieve more flexibility in required flow ratios determination for each ring.

On a ring, the sources are normal equally distributed at angular positions $$\alpha_{i,j} = \alpha_{or(j)} + \frac{(i-1)}{N_j} \times 2\pi$$

($\alpha_{i,j}$ is in radian the position of the ith sources of Nj on ring j of radius Rj, see FIG. 2, and $\alpha_{or(j)}$ is a constant for ring j). We claim the possibility to introduce a phase shift between holes position on different rings to improve angular uniformity (i.e $\alpha_{or(j)\ may}$ be different for all rings). This effect will be more efficient when a reduced number of holes per ring are used. We also claim the possibility to distribute the holes unevenly on a given ring, in particular to compensate angular distribution anisotropies due to several rings interactions.

Variable Flows and Fast Switching Between Uniform Species Impinging Rates and Tailored Distributions Useful to Achieve Several Conditions on a Single Wafer in a Production Process or to Achieve Combinatorial Experiments to Investigate Materials Properties.

A key factor in thin film deposition R&D is the possibility to achieve combinatorial experiments to investigate thin film materials properties. The possibility to produce devices with graded properties within a single deposition may also be of main interest as it could allow a single fully integrated solution to sweep a wide range of conditions. While combinatorial has been already investigated by several approaches, the possibility to achieve complex integrated devices with graded properties is a totally new approach. With regard to combinatorial, it is extremely interesting to have a system which is flexible enough to allow either homogeneous deposition or combinatorial deposition with composition gradients. A fast reversible device allowing these two configurations is one of the targets of this patent. Our proposed innovative approach is the possibility to shape the distributions of impinging molecules on the substrate in an alternative and/or complementary approach to homogeneous and uniform configuration. We propose a solution where the distributions of impinging molecular species may be calculated accurately and does not depend on molecular species or on complex processes of gaseous molecular inter-diffusion that also run the risk of introducing gas phase reaction. The disclosed improvement is related to molecular impinging distribution shaping either in space (x,y,z) and/or in time (t). In opposition to the previously described configuration where uniform impinging rates where sought, we now target the possibility to achieve controlled graded chemical compositions, and more generally graded properties, on the same sample by varying the impinging rates distribution of the different species on the substrate. Similar effects could also be achieved by playing with assisting beam fluence distribution and/or induced thermal gradients.

Combinatorial studies have been carried out by low pressure CVD [46, 47], atmospheric pressure CVD [19], sol gel [32, 22], PLD with carousel masking [26], multiple gun sputtering system [35, 30], powder mixing [38], combinatorial laser MBE [39], inkjet printing [45]. The aim of these studies is to identify new materials exhibiting interesting properties.

An apparatus of closer interest with a segmented showerhead was developed for CVD for combinatorial, but it was based on effusion and re-pumping of the chemical precursor controlled locally at the substrate vicinity [2]. This technology was demonstrated to produce either uniform thin films or controlled non uniform film [8, 36]. In this apparatus, the combinatorial is achieved by removing excess gas and does not prevent inter-diffusion of precursors and gas phase reaction that is avoided in our design. A further limitation is that the gradients are limited to very short distances thus enabling a lower sensibility not preventing effects such as surface migration of precursors. Recirculation may also introduce some lack of reproducibility due to cross contamination of the flows.

A first solution, to achieve non-uniform gas impinging rates on the substrate, is to have asymmetric distributions of the sources. The disadvantage of this solution is its poor reversibility to a uniform impinging rate configuration. Further simple possibilities are either to introduce a tilt of the substrate, to introduce an asymmetry, or to modify the distance h of the sources from the substrate. The difficulty in these further approaches lays in poor reversibility because the substrate motion is particularly hindering if patterning of the substrate is targeted. Furthermore, highly controlled distributions with large variation ratios between the species are difficult to achieve.

Figure 6A:
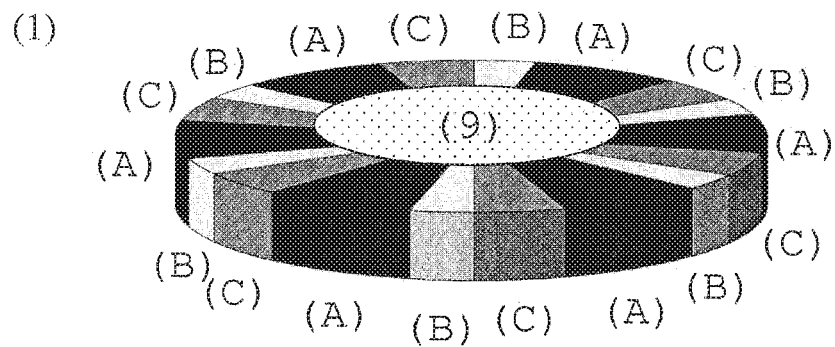
FIG. 6A—Presents an example of division of the pre-chamber into 18 torroidal quarters, for 3 different precursors labeled (A), (B) and (C). The number of precursor, number of quarter per precursor may vary, and the quarters for the different precursors may be identical or different. A void central place is kept in the middle for beam irradiation (9).
Figure 6B:
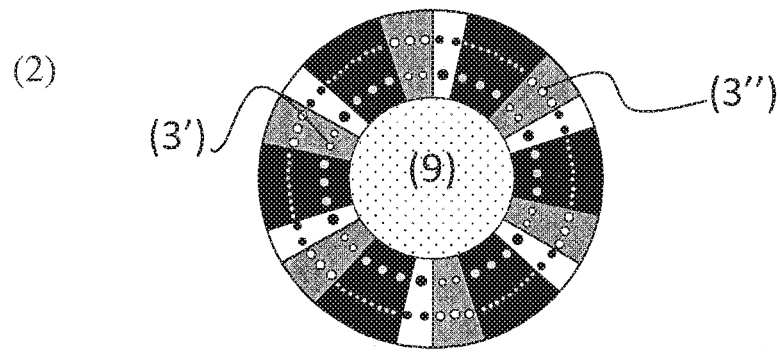
FIG. 6B—Presents a top view of the pre-chambers, highlighting an example of source distribution for the different precursors, with two effusion rings. The pinholes are symbolized by the small dots on the quarter. Number and size of the holes may vary for the different precursors on a same ring, but on a quarter, the ratio of flow from the sources on the different rings should be identical.
Figure 6C:
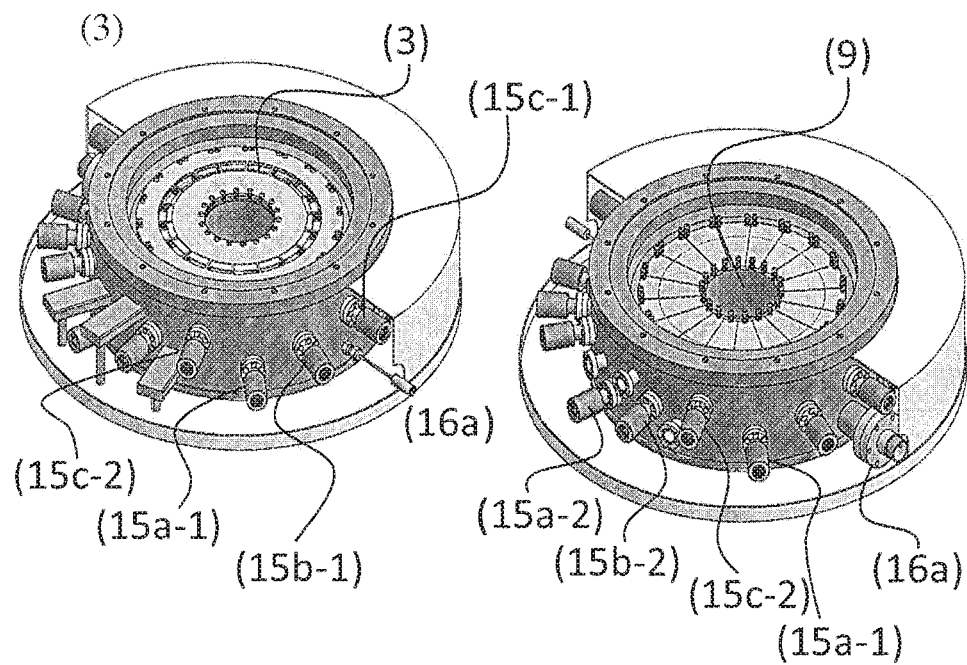
FIG. 6C—Presents a technical drawing for the realization of such a system.

In the present invention the pre-chamber is separated into several independent quarters (see FIG. 6 (FIG. 6A, 6B, 6C)), with at least one (but preferably several) quarter for each chemical precursor, and a system of valves (shutters) allows independent regulation of the gas inlet into each quarter, the flow being null, maximal, or modulated between these two values by the degree of aperture of the valve(s). To be noted that all the quarters for a given precursor are preferably of the same dimension, but different precursors may have quarters of different dimensions. Sources, effusive holes, are distributed on the top wall of the pre-chamber quarters, according to configurations described in the previous section. To be noted that in this case, the minimum number of sources to ensure radial homogeneity becomes the minimum number of quarters per precursor. As a general rule, the higher the number of concentric rings distributions of holes, the lower the distance from the sources to the substrate, the higher the number of quarters required.

The flow of a precursor for such a system is correctly described by the flow of a multi-ring system, where the dimensions of the ring sources are kept constant, but the sources of a ring on a quarter are replaced by a single source placed in the middle, with a $f_i$ corresponding to the sum of the flows of the quarter sources.

To achieve asymmetric species gradient distributions on the substrate, at least 1 quarter should deliver flow for each species, while to obtain uniform distribution at least 3, preferably 6 or more quarters evenly distributed on the circumference are required.

In the case of valve regulation, a homogenizer ring before the valves of the quarters is required (as previously described) to improve the control of species distributions independently of the number and degree of aperture of the quarter valves such that the pressure in the pre-chamber quarters (and thus the effusing flow) is exclusively determined by the valve aperture. Said ring conductance should be larger than the conductance of the full set of the pre-chamber quarter apertures to obtain an identical pressure at each of the quarter valves and thus allowing a single pressure measurement for all the quarters. A ratio of 10, or 100, between the homogenizer ring conductance and the valves conductance is preferred. On-off regulation of the valves should be preferred such that the conductance of a quarter inlet aperture is larger than the conductance of the sum of the effusive holes conductance for a given quarter to avoid pressure gradients inside the quarters. This is of particular importance if multiple ring holes distributions are used. However, a pressure gauge measuring the pressure in the homogenizer ring may allow the regulation of the valves aperture providing an indirect measurement of the valves conductance through the use of an independent calibrated mass flow controller and thus a further modulation of each pre-chamber quarter pressure.

Figure 7A:
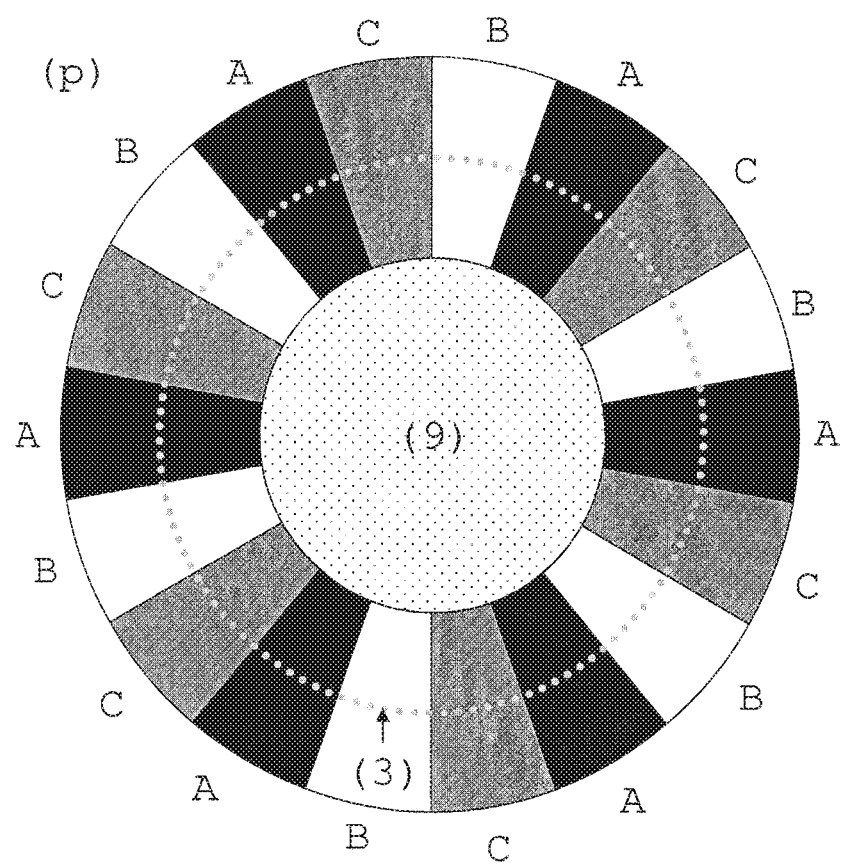
FIG. 7A—The system depicted in (p) consists of 18 quarters, connected to 3 precursors labelled A, B and C (A quarters in black, B quarters in white and C quarters in grey). A unique source ring (r) is placed at R=115 mm, h=147.5 mm, facing a substrate of rsub=75 mm, with 10 sources per quarters.
Figure 7B:
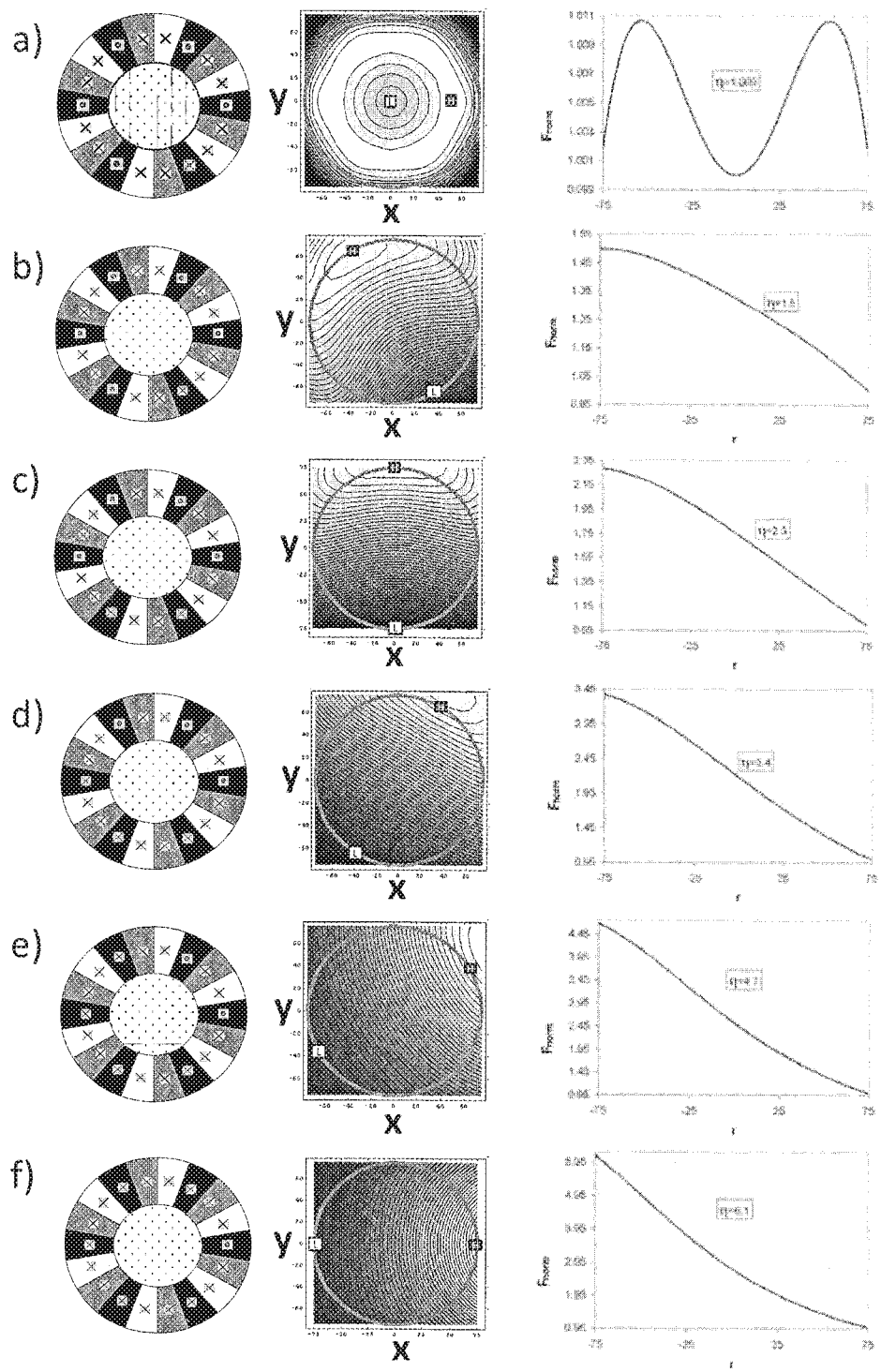
FIG. 7B—The case where only the quarters of precursor A are active. We study the case where 6 or less of these A quarters are active, which is symbolized in the next rows as • when the quarter valve is open (full flow) and X when the quarter valve is close (no flow). For each configuration, a contour plot of the flow on the substrate is shown, highlighting with L the point of lower flow and with H the point of higher flow, the substrate edge being represented as a grey circle. For each case, the variation of the flow along the substrate diameter (HL) is plotted versus distance r from the centre, and the reported value η corresponds to the ratio of the flows in H and L. When all quarter are active, case (a), the flow distribution is homogeneous and h=1. With decreasing the number of active quarters from 5, case (b), to 4, case (c), to 3, case (d) to 2, case (e) to 1 case (f), h increases up too more than a factor of 6.

An example of the principle of switching from homogeneous deposit to controlled inhomogeneous deposit using a system designed for the use of 3 precursors, with 6 quarters per precursor, is presented in FIG. 7 (FIG. 7A, 7B), where the only active quarters are those of precursor A. When all A quarters are active, the flow distribution on the substrate is homogeneous, case (a), while when some quarters are inactive, cases (b,c,d,e,f), the flow distribution presents a gradient. In the example depicted here, the flow distribution may vary monotonously along a substrate diameter of a factor up to more than 6.

Figure 8:
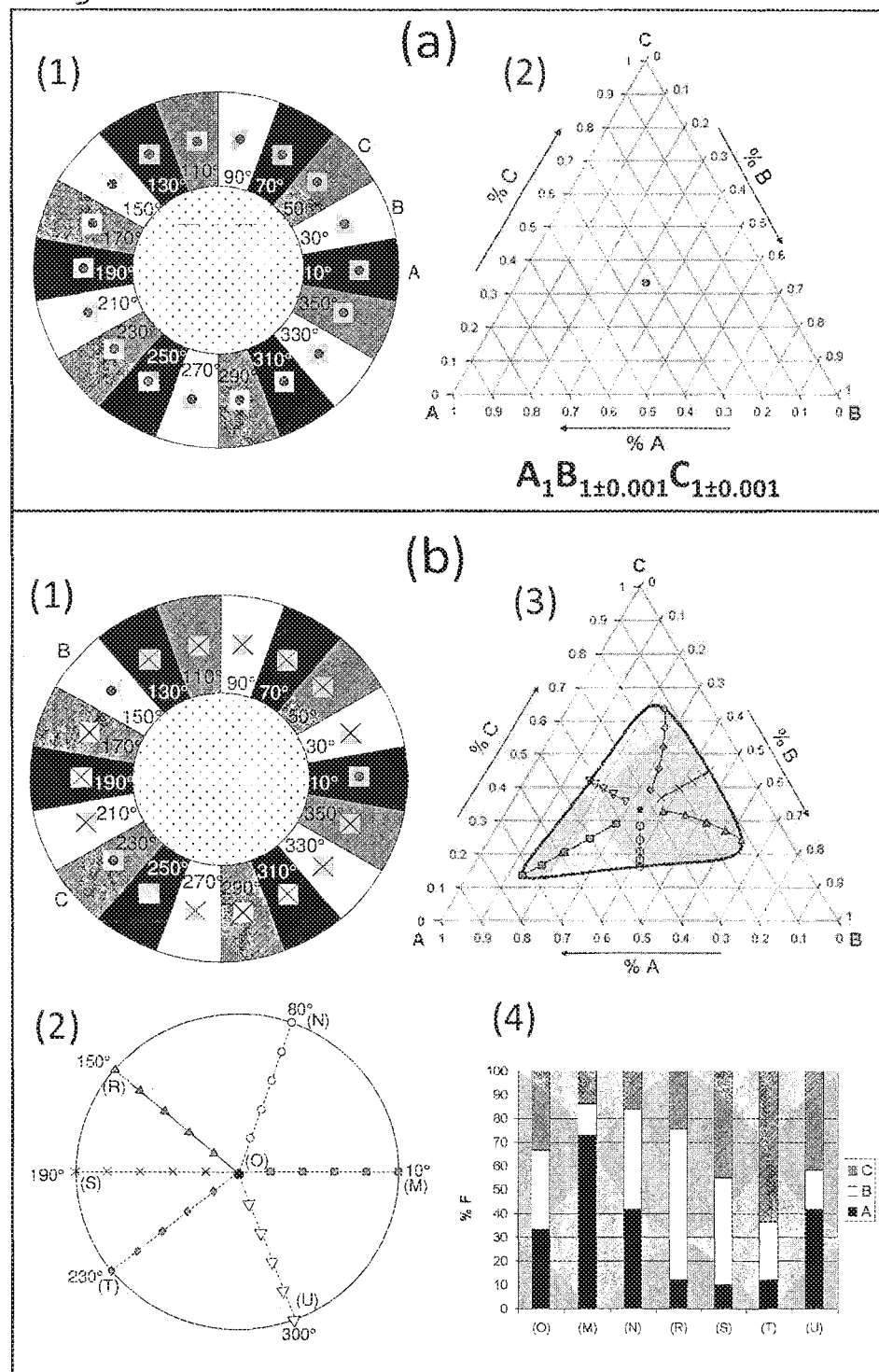
FIG. 8—Example of homogeneous and combinatorial deposition with 3 precursors.

Some examples of the application of the system to combinatorial deposition are depicted in FIG. 8 (FIG. 8), where the same system is used with 3 precursors (with an identical total flow for each precursor). If all the quarters are active, the deposit is homogeneous over the whole substrate (case a)). If only one quarter per precursor is active as depicted in case (b), a very large region of the possible flow composition on the substrate $A_1B_xC_z$ (with x,z<1) is covered. Any other configuration with other active quarters, or with varying the respective total flows of A, B and C, allows to explore a wide range of flow composition variation on the substrate.

This system configuration with quarters is more interesting than substrate tilting or asymmetric distributions of flows as it is rapidly reversible to uniform deposition and does not require substrate motion that limits patterning resolution with particle beams, due focal problems and positioning control, and reproducibility. It furthermore allows greater flexibility (with 18 quarters, more than 8,000 combinations=30 per precursor to the third power) already without introducing any precursor pressure ratios variation) and the possibility to scan very precisely the vicinity of any stoichiometry.

Figure 9:
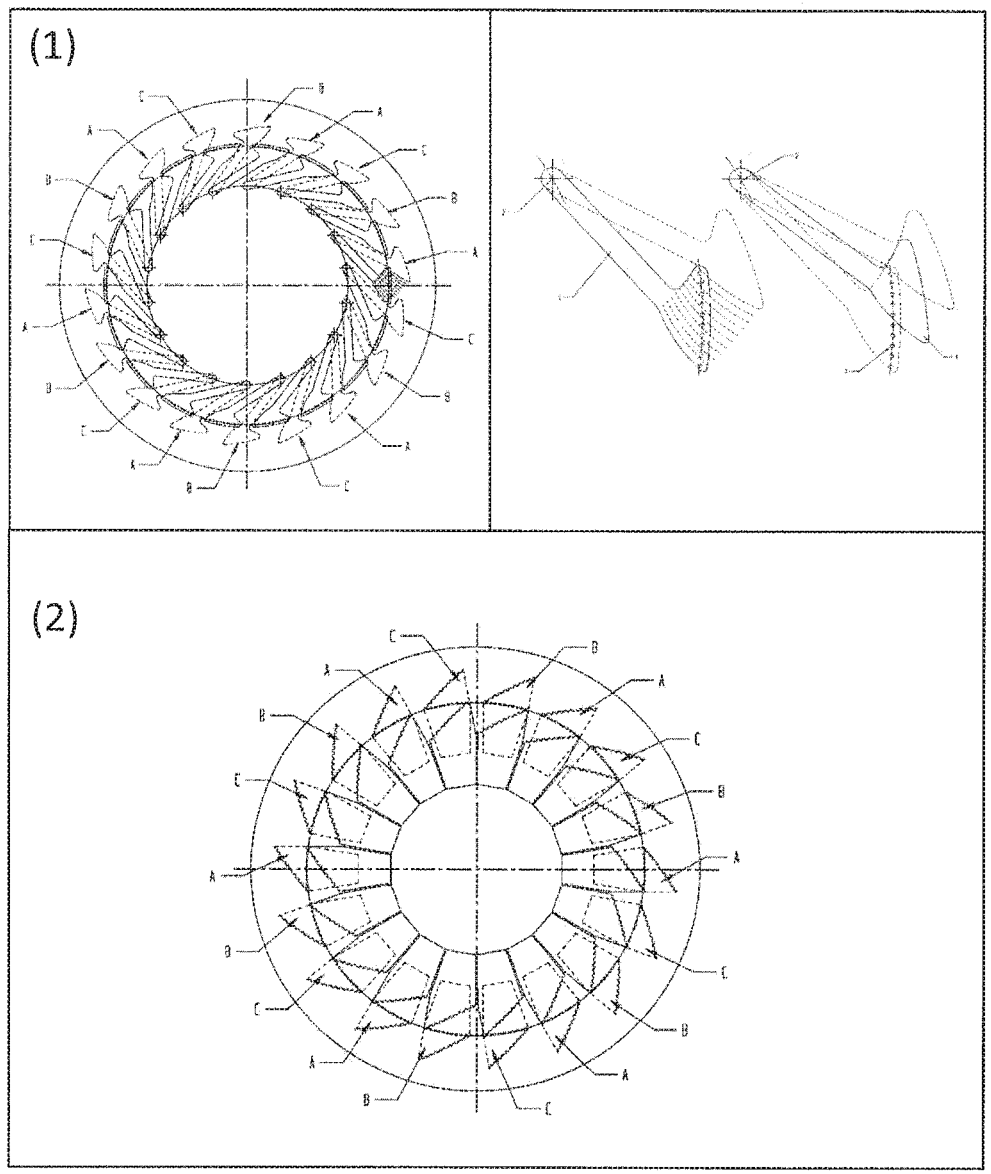
FIG. 9—Shutters for pre-chamber principles.

An alternative to valve modulation to achieve the same effect is to use a shutter that may selectively covers a selected number of sources appertaining to a given pre-chamber quarter as reported in the FIG. 9 (FIG. 9). The advantage of this configuration is that modulation of the flows is more flexible and easily achieved while a single shutter is required for each pre-chamber quarter whatever the number of sources of this pre-chamber quarter.

Figure 10:
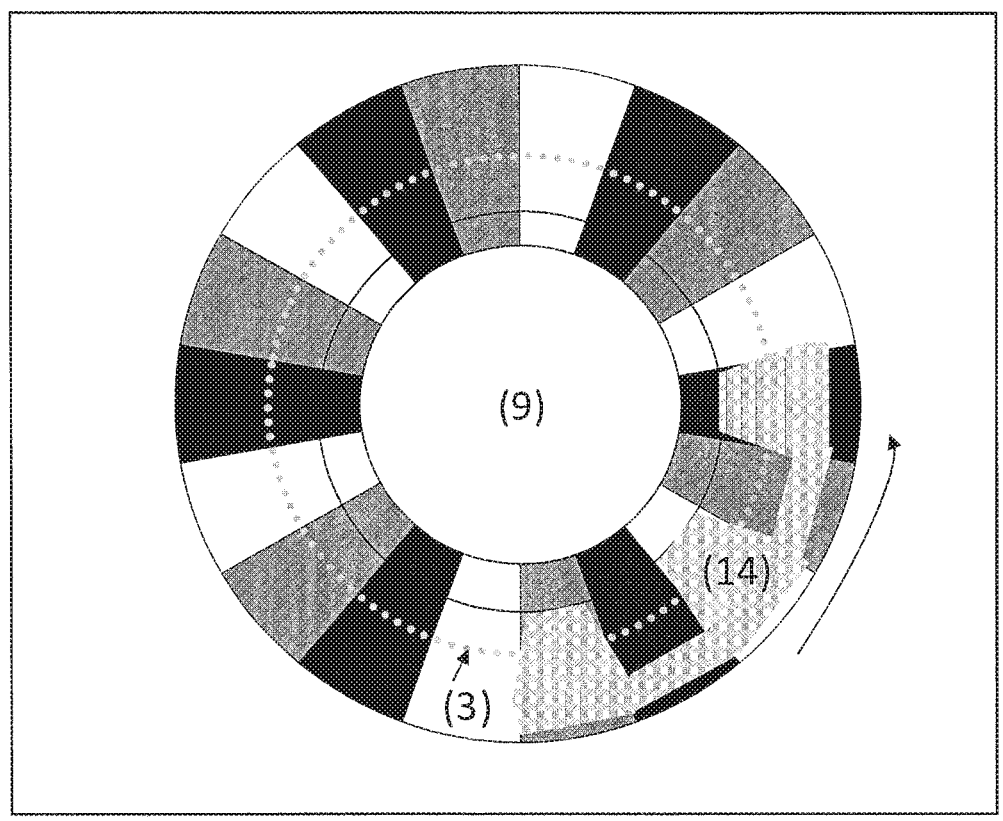
FIG. 10—Rotating shutters principle.

A further alternative is to have several superposed rotating shutters as reported in FIG. 10 (FIG. 10) that, by playing on their phase shift and rotating speed, may allow fast modulation of the different species flows. The advantage of this solution is that only one mechanism per shutter is required independently of the number of pre-chamber quarters.

A further possibility is to play with assisting beams to modulate the decomposition rate instead of the impinging rates. By selective irradiation, local modification of growth conditions may lead to new materials. Combinatorial based on fluence gradients and/or thermal gradients are possible.

Several Rings and Precursors Versus Size and PIE Optimization

When several precursors and rings are targeted simultaneously, most of the improvement can be achieved only to a limited extent. A main disclosed improvement is the way around to arrange elements relatively to each other to achieve an effective reactor and remove as much as possible the limitations.

A first solution is to have sets of concentric rings for each species as patented by Benvenuti [5], but this configuration gives only limited results. For example, if 3 species and 6 rings for each species are used (for a total of 18 rings), the overlap of the correct positions is such that the optimal configuration is difficult to achieve. If the same distance h of all the rings to the substrate is targeted to avoid the drawback effect of introducing shadowing and back-scattering of molecular species from side-walls of other pre-chambers disrupting the targeted distribution, the device is even more challenging. Additionally, the flow distribution is different for each precursor which may induce a larger inhomogeneity in the total distribution.

Our alternative to this concentric rings solution is to replace full source rings for each precursor by alternating source ring segments for all precursors on a given ring. It allows the possibility to target configurations, from Table 1 or similar, with smaller reactor size and better PIE for a given homogeneity, each precursor having the distribution calculated for a single precursor.

Such a configuration can be achieved in two ways:

(i) using the solution described in the previous section, with pre-chamber quarters. To increase PIE and reduce reactor size, the distance h should be reduced, which means to obtain a given flow homogeneity on the substrate, increase the number of quarters. The limitation of this solution comes from the number of quarter that can be arranged geometrically in the system.

Figure 11:
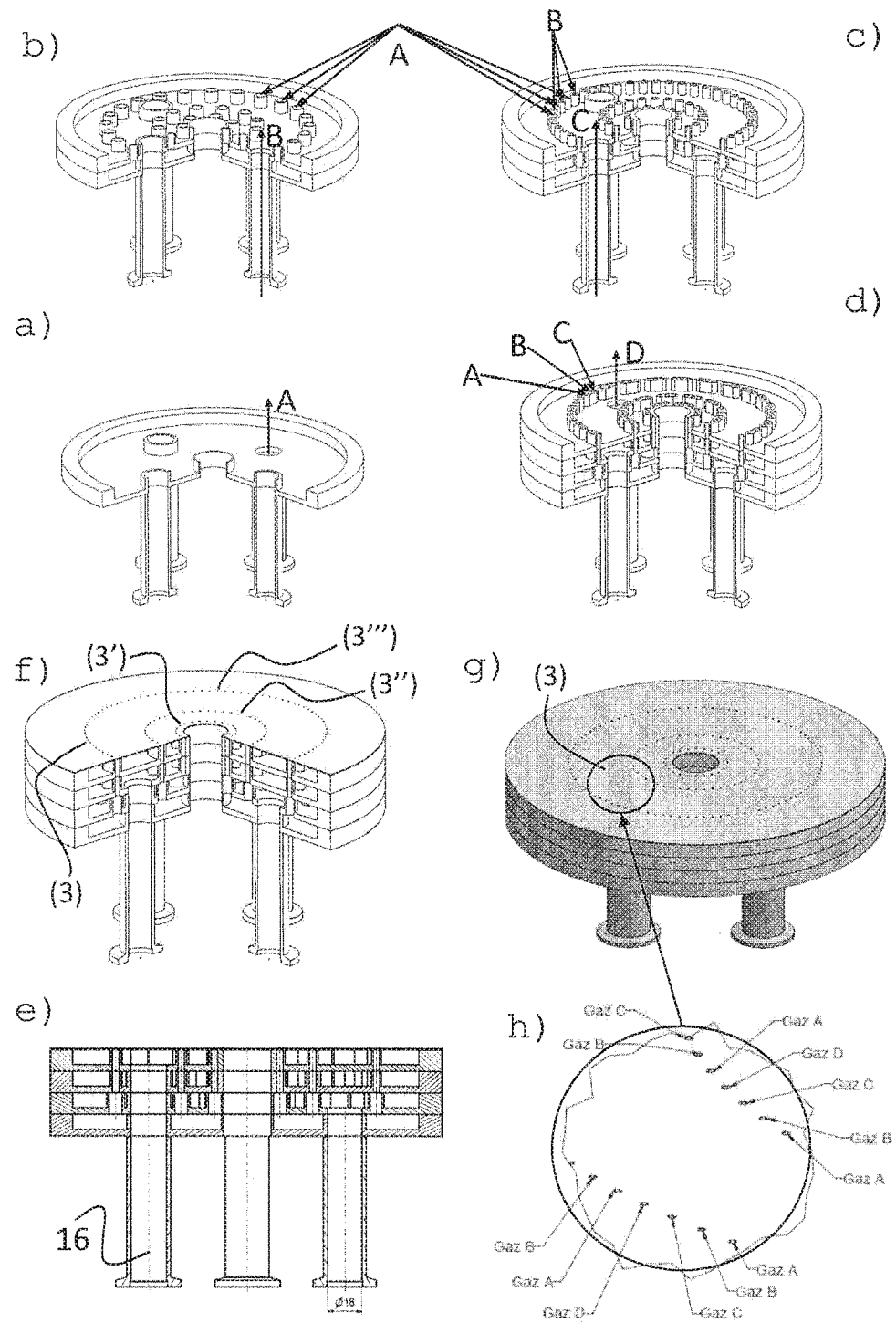
FIG. 11—Principle of the system with segmented rings of precursors.

(ii) using stacked pre-chambers with pipes cutting through these pre-chambers, allowing all the ring sources to be segmented into a large number of source segments for each precursor (see FIG. 11 (FIG. 11)). Our design minimize pressure drop (gas transport) because of the large channels conductance from the reservoir to the effusive holes. This is achieved by pipes progressive conductance drop and with a pre-chamber with large horizontal conductance to homogenize the pressure inside a given channel. Eventually up to 2 precursors can be used per level. The disclosed design is of particular relevance when the pressure inside the pipes is low because of low vapor pressure of species.

A similar design of stacked pre-chambers has already been proposed and patented [31, 9], but not associated with a design made on molecular flow calculations for Chemical Beam Epitaxy (but rather for higher pressure CVD). In the case of low vapor pressure in the pre-chamber our design is much more efficient.

Figure 12:
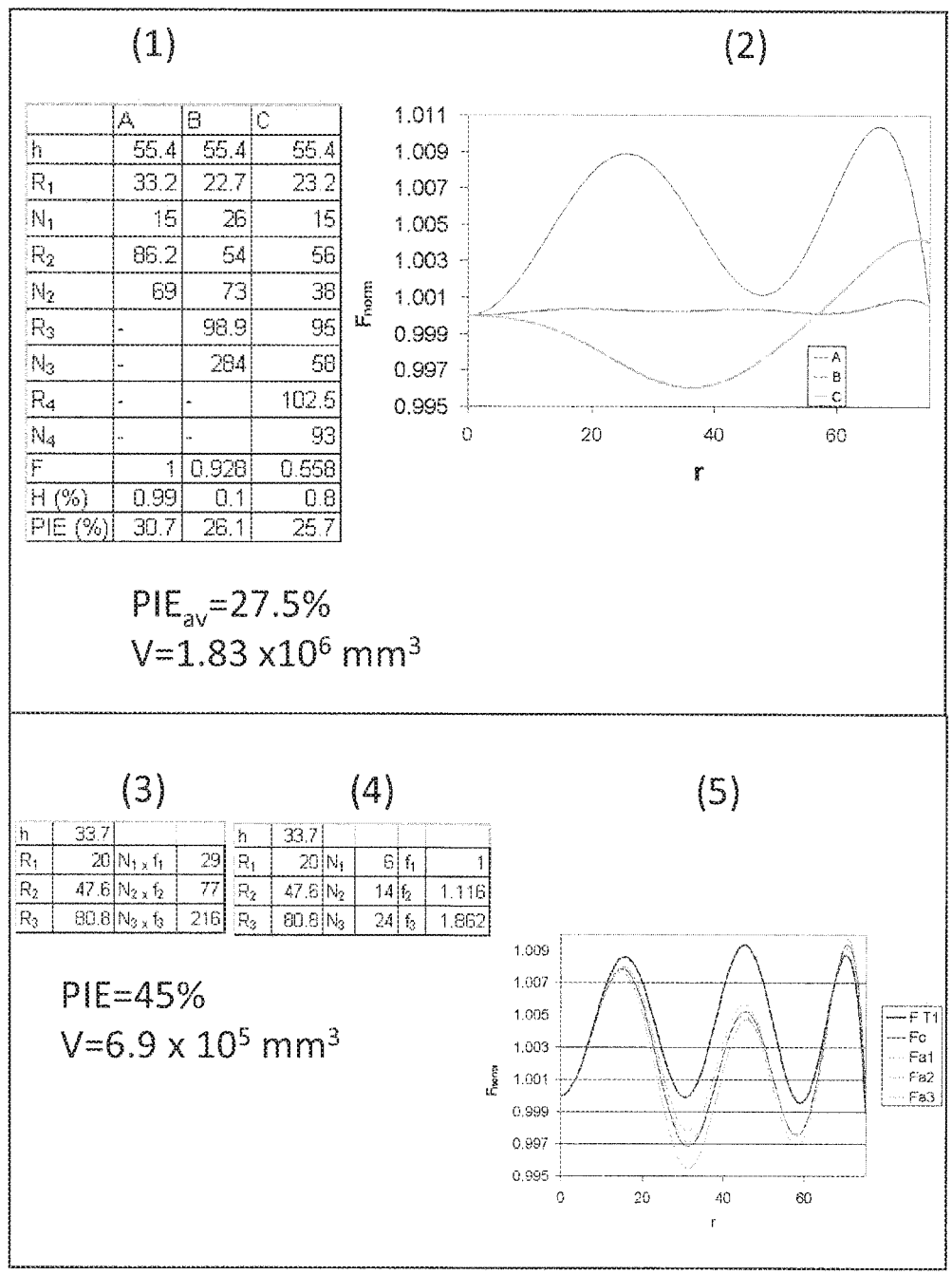
FIG. 12—Comparison of examples with concentric ring sources and segmented ring sources for 3 precursors.
Figure 13:
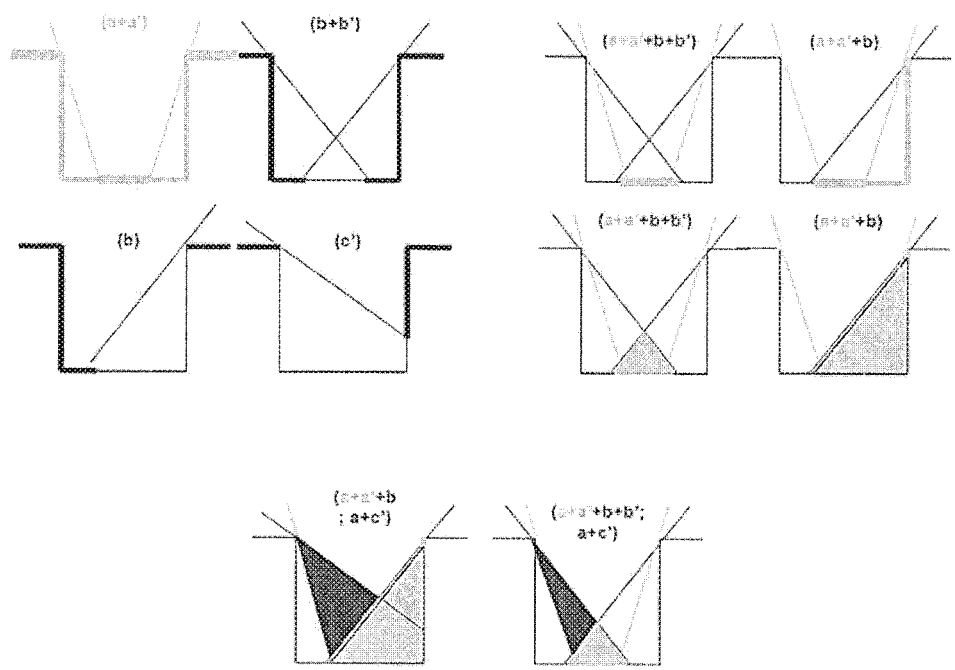
FIG. 13—Self patterning of deposits in trenches or cavities playing on activation energy modification of precursor 1 (a+a') by precursor 2 (b+b') providing relative flow modulation up to total growth inhibition. Several configurations and examples are shown to grow complex 3D structures.

An example of the realization of a stacked configuration is given in FIG. 12 (FIG. 12) and compared to an equivalent solution in term of homogeneity for the concentric rings.

As a final possible improvement, we propose to use tilted and/or sub-cosine sources to increase the radius of the associated ring. As a matter of fact, the numerical aperture for the beam irradiation decreases if the number of rings is increased and the distance h decreased to maintain good flow homogeneity. Though, the increase of the source ring diameter with source tilting or sub-cosine source use enables to increase the numerical aperture. It further allows a larger perimeter to accommodate more source segments, thus resulting in a higher angular homogeneity but also in higher growth rates, while maintaining the targeted impinging rate homogeneity or more generally distributions.

In preferred embodiments, a showerhead quarter according to the invention is adapted to support an inner pressure ranging between $10^{-6}$ and 10 mbar, and with outlets having a diameter less than 5 mm, such outlets being distributed on at least one annular array on the showerhead external surface, said surface being flat or having geometries of concave, convex, or with angular and/or radial recurrent symmetries, and said surface having a thickness in proximity of the outlet positions of less than 1 mm.

Improved Cryo-Panels with Shutters are Proposed to Abruptly Interrupt the Deposition Process and to Pulse the Beams.

Shutters were proposed to do molecular beam Atomic layer Epitaxy (ALE) by switching on or off molecular beams of different species [44]. The possibility to expose the substrate alternatively to different precursors enables the deposition of multi-layer structures (which have been widely deposited for III-V semiconductor multilayer structures [3]) or the deposition of ultra-thin layers that can be afterwards annealed into a homogeneous film [21]. A novel cryo-panel design is proposed as described below:

- A cryo-panel at 360° coated with heat reflective materials (copper, silver, dielectric IR mirrors, is proposed to reduce heat exchange between cryo-panel and substrate heater and to achieve a black body cavity to improve substrate temperature homogeneity avoiding asymmetric IR reflections and/or depletion of radiation due to large apertures that break thermodynamic equilibrium. The cryo-panel will also protect window or aperture from desorbed precursor or by-product molecules.
- One or more diaphragms or small apertures are introduced in the cryo-panel to allow molecular effusion from the sources, image projection to pattern the substrate with beam irradiation, and in-situ monitoring.
- The cryo-panel is compatible with the disclosed shutter that is further cooled by it by radiation exchange to avoid re-emission of molecular species and by-products that may lead to parasitic deposition.
- One possible shutter is composed of several (2 or more) superposed plates with apertures that can be in phase (alternated pulsed beams), in opposition of phase (shutter), or with a variable phase shift to achieve asymmetric spatial and/or temporal periodic distributions.

The Possibility to Stack Several Components to Optimize Multi-Wafer Deposition (Use Only 1 Pre-Chambers and Only 1 Substrate Heater for Two or More Substrates).

- A pre-chamber that can provide a flow in 2 opposite directions (top-down, right-left) to coat 2 substrates simultaneously.
- Several systems are superposed with the following periodicity pre-chamber substrate, heater, substrate, pre-chamber, substrate, heater either vertically or horizontally.
- A pre-chamber that can provide a flow in more than 2 directions (6 opposite directions) to coat simultaneously (central symmetry: precursor delivery at the centre and substrates to the outer periphery).

SUMMARY OF THE DRAWINGS (FIG. 1)—Principle of the Precursor Effusion from the Source to the Substrate, According to the Prior Art.

A constant vapor of precursor Pp is obtained in the pre-chamber (2) by a controlled heating of a precursor reservoir (1) connected to this pre-chamber (typically, 10-3<Pp<10 mbar). Several effusion sources (3), consisting in apertures in the pre-chamber top wall facing the substrate inside a main growth chamber (4), separate the pre-chamber from the deposition chamber. In the deposition chamber, a lower pressure Pc than in the pre-chamber is maintained (typically, Pg<10-3 mbar), and the substrate heater and the substrate (6) are held. An oriented chemical beam of precursor is generated from the source towards the substrate with line-of-sight molecular trajectories from the source to the substrate. The flow density in any direction is correlated to the angle θ (angle of effusion with respect to the source symmetry axis). In order to maintain the line of sight trajectory, the growth chamber is surrounded by a cryopanel (5) which condensates any molecules colliding with it coming from the source. The sources are aligned in a plane parallel to the substrate, but the apertures may be locally tilted by an angle Φ with respect to the normal source plane. The sign convention φ>0 is if the sources are tilted towards the system center, while φ<0 if the sources are tilted towards the outside.

(FIG. 2)—Basic Geometry of the Reactor. According to the Prior Art.

The sources are placed on a source plane parallel (13) to the substrate plane (12), distant of h. The sources are distributed on concentric rings (here, a single ring is represented, (3)), whose rotation axis is the substrate rotation axis. A window (9) may be placed in the center to enable irradiation of the substrate (6). On the jth source rings, Nj sources are regularly distributed on a circle of radius Rj and the ith source of the ring has the angular position $\alpha_{ij}$. It is possible to calculate the precursor flux at the point M of the substrate of polar coordinates (r,β) coming from the source Sij, pinhole of area A, according to Equation 1.

Figure 3A:
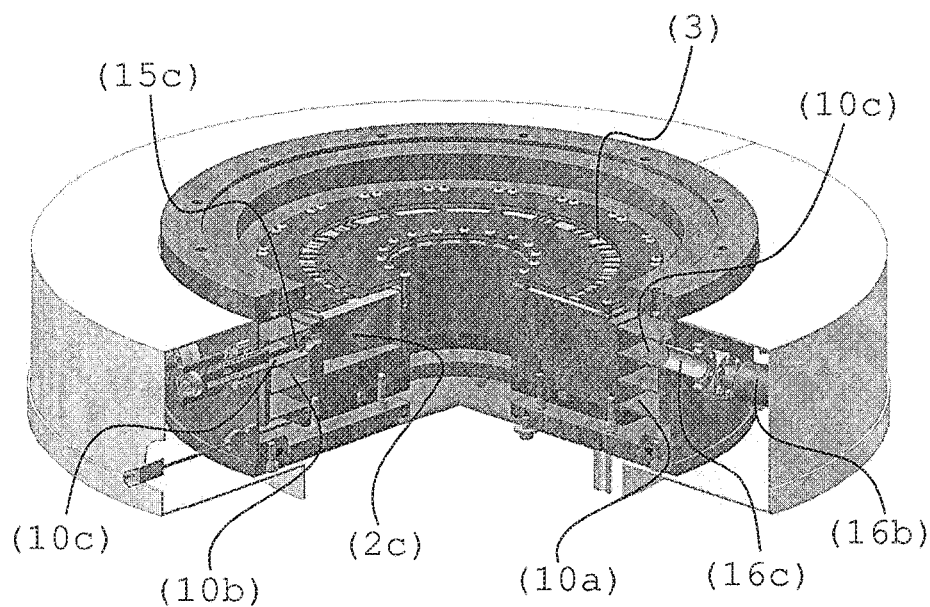
FIG. 3A—Shows a sliced view of the system with the homogenizing ring, the pre-chamber itself with the effusing holes, the valves separating the pre-chamber from the homogeneous ring, and the thermal shields on top of the of the prechamber.
Figure 3B:
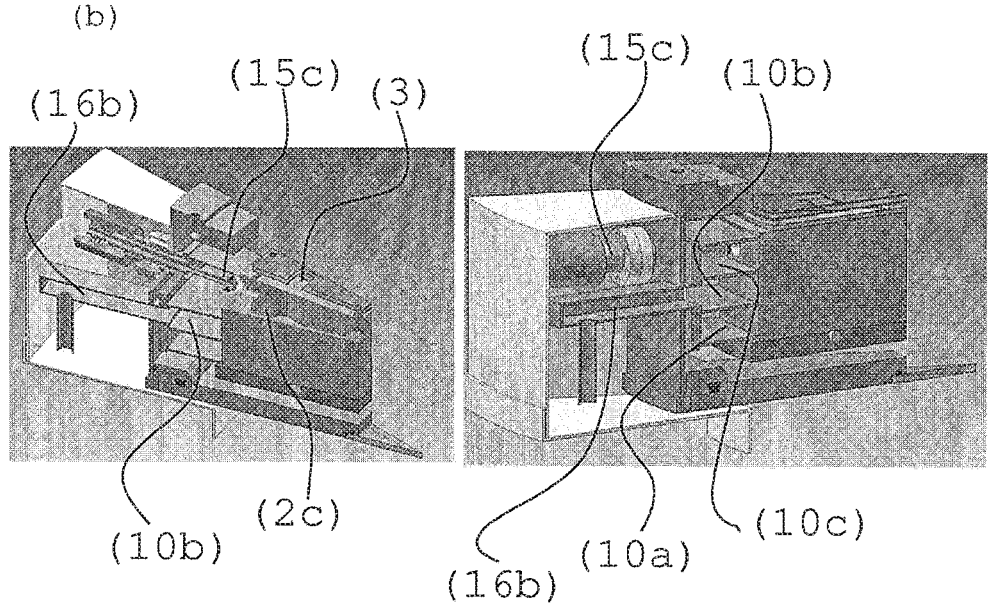
FIG. 3B—Detail view of FIG. 3A.
Figure 3C:
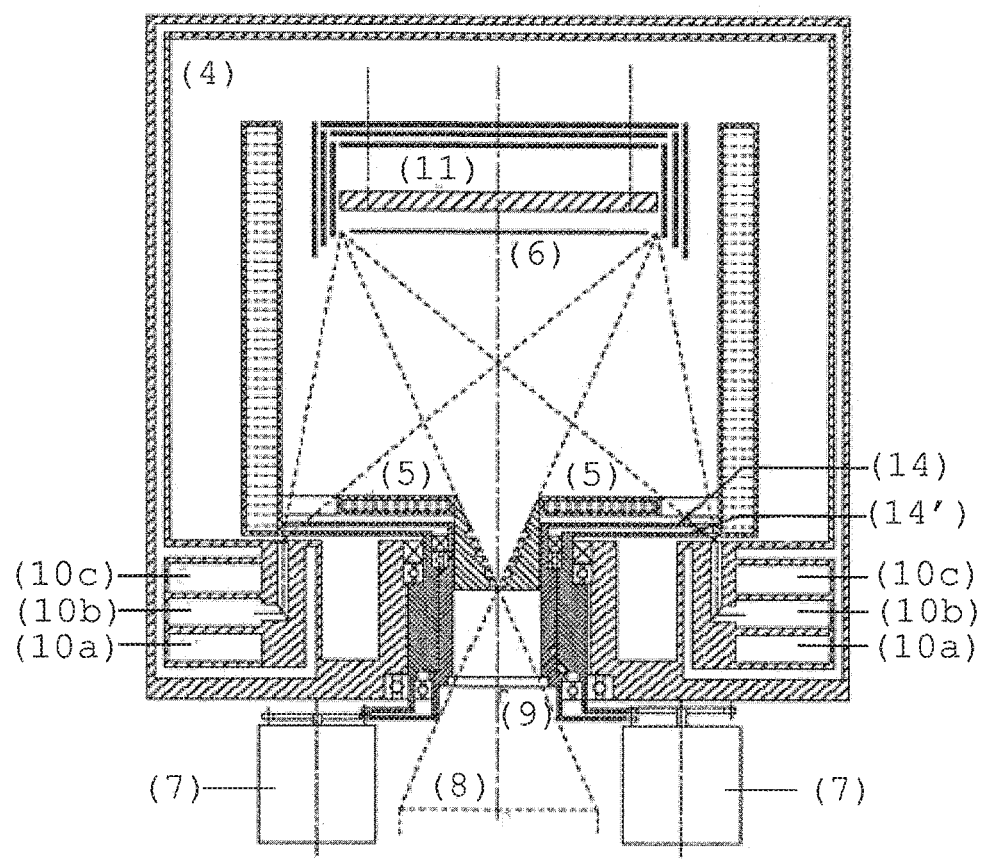
FIG. 3C—General side view of a reactor.

(FIG. 3A, 3B. 3C)—Homogenizing Ring Between Precursor Reservoir and Pre-Chamber.

a) FIG. 3A—Shows a sliced view of the system with the homogenizing rings (10, further referenced a,b,c respectively for precursors A, B, C), the pre-chamber (2, further referenced c for precursor C) itself with the effusing holes (3), the valves (15c) separating the pre-chamber 2c from the homogeneous ring 10c, the lines (16, further referenced b, c since feeding respectively precursors B, C to homogenizing rings 10 b, c) and the thermal shields on top of the of the prechamber.

b) FIG. 3B—Detail view of FIG. 3A.

c) FIG. 3C—General side view of a reactor: (6) is the substrate to be coated, (11) is the substrate heater. (5) is the cryo-panel, (4) is the growth chamber, (10a, 10b and 10c) are the homogenizing rings (respectively for precursors A, B, C), (14,14') are the shutters, (7,7') are the shutter engines to achieve rotation, (8) is a diaphragm to irradiate the substrate through a small aperture to reduce chemical precursor and by products re-emission from the walls and (9) the window or an aperture for beam irradiation.

(FIG. 4)—Interesting Results PIE Vs H Obtained with Multi-Ring of Sources.

Optimization of the multi-ring system has been carried out, and some interesting results are presented here, for respectively 1 ring (1), 1 ring of tilted sources (1-t), 2 rings (2), 2 rings of tilted sources (2-t), 3 rings (3), 3 rings of tilted sources (3-t), 4 rings (4), 5 rings (5) and 6 rings (6).

(FIG. 4A)—Table 1—Example of Interesting Configurations Calculated for $r_{sub}=75$.

The configurations presented here are interesting configurations to be used with the multi-ring system, in term of PIE obtained for a given h.

(FIG. 4B)—Table 2—Minimal Number of Sources to Ensure Angular Homogeneity.

The homogeneity calculated from FIG. 2 considers only the radial flow profile. With a limited number of sources, an angular inhomogeneity is added to the radial inhomogeneity. The present table presents as a function of R and h the minimum number of sources that should put on a ring such that the radial inhomogeneities increase of less than 5% the H value calculated from the flow described by Equation 2, for $r_{sub}=75$.

(FIG. 5)—Example of Ring Splitting

An initial configuration found in Table 1 with 4 initial rings is split into 9 rings (see values on the left table). For clarity sake, we assume in this simple example that all the holes have the same area and flow.

The flow profile on the substrate (curve N) is almost non affected by the splitting (curve S), the homogeneity values Hn and PIE are also almost non affected (after splitting, Hs and PIEs), while the growth rate can be increased by a factor 2 (normalized value G.R.norm$_n$ becomes G.R.norm$_s$).

(FIG. 6A, 6B, 6C)—Principle of Pre-Chamber Quarters for Each Precursor (1) FIG. 6A—Presents an example of division of the pre-chamber into 18 torroidal quarters, for 3 different precursors labeled (A), (B) and (C). The number of precursor, number of quarter per precursor may vary, and the quarters for the different precursors may be identical or different. A void central place is kept in the middle for beam irradiation (9).

(2) FIG. 6B—Presents a top view of the pre-chambers of FIG. 6A, highlighting an example of source distribution for the different precursors, with two effusion rings (3', 3"). The pinholes are symbolized by the small dots on the quarter. Number and size of the holes may vary for the different precursors on a same ring, but on a quarter, the ratio of flow from the sources on the different rings should be identical.

(3) FIG. 6C—Presents a technical drawing for the realization of such a system, highlighting the effusion ring (3), the valves (15) separating the pre-chamber from the homogeneous ring, the lines (16) feeding precursors to homogenizing ring; 16x: precursor alimenting line for precursor x; 15x-i: valve regulating alimentation of ith of 6 compartments for precursor x; x=one of the three precursors A,B,C.

(FIG. 7A, 7B)—Example of Thickness Graded Deposit Using a Single Precursor.

FIG. 7A—The system depicted in (p) consists of 18 quarters, connected to 3 precursors labelled A, B and C (A quarters in black, B quarters in white and C quarters in grey). A unique source ring (3) is placed at R=115 mm, h=147.5 mm, facing a substrate of rsub=75 mm, with 10 sources per quarters.

We consider the case where only the quarters of precursor A are active. We study the case where 6 or less of these A quarters are active, which is symbolized in the next rows (FIG. 7B) as • when the quarter valve is open (full flow) and X when the quarter valve is close (no flow). For each configuration, a contour plot of the flow on the substrate is shown, highlighting with L the point of lower flow and with H the point of higher flow, the substrate edge being represented as a grey circle. For each case, the variation of the flow along the substrate diameter (HL) is plotted versus distance r from the centre, and the reported value η corresponds to the ratio of the flows in H and L. When all quarter are active, case (a), the flow distribution is homogeneous and h=1. With decreasing the number of active quarters from 5, case (b), to 4, case (c), to 3, case (d) to 2, case (e) to 1 case (f), h increases up too more than a factor of 6.

(FIG. 8)—Example of Homogeneous and Combinatorial Deposition with 3 Precursors.

The system considered is the same as the one of FIG. 7 (FIG. 7A-7B), except that 3 precursors are used, with one active quarter per precursor as depicted in (1). The flow composition evaluated on the substrate is reported on the ternary diagram represented in (3). The grey area corresponds to the compositions found on the whole substrate. The different points reported on the ternary diagram correspond to special points of the substrate, along some diameter, with the legend given in (2). Finally, (4) represents the flow composition on the substrate at selected points reported in (2).

(FIG. 9)—Shutters for Pre-Chamber Principles.

Each quarter has its own shutter, which can close the whole quarter sources, some of the pre-chamber sources, or no sources depending on its position. Several cases can be considered: (1) The shutters close or open by a rotation motion. All the shutters have their axis of rotation/fixation placed on a same ring which is concentric with the source ring. The shutters can close or open with a rotation from inside to outside or from outside to inside, depending where they are fixed. (2) The shutters open or close by a translation motion. Depending of their open position, they can close moving towards the system center or towards the system edges.

(FIG. 10)—Rotating Shutters Principle.

The shutter(s) (14) is designed such that it hides some of the sources of the ring source (3), and by rotation around the axis of symmetry of the system, it changes the sources it hides. The shutter can have any rotating shape. Several shutters can be used simultaneously, with same or different direction of rotation and/or speed of rotation. It can either be angularly asymmetric as reported above or symmetric if different species should not impinge on the substrate simultaneously.

(FIG. 11)—Principle of the System with Segmented Rings of Precursors.

The system presented here allows the use of 4 precursors labeled (A,B,C,D) with a configuration with 3 segmented sources rings (3', 3", 3'"). The four pre-chambers are stacked, with first the pre-chamber A (drawing (a)), then the pre-chamber B (drawing (b)), then the pre-chamber C (drawing (c)) and finally pre-chamber D (drawing (d)). An open view of the tube (15) feeding the precursors and connecting the pre-chamber is presented in (e) and (f), while (g) and (h) present the disposition of the sources on the top plate, with alternating ring segments of sources A, B, C and D.

(FIG. 12)—Comparison of Examples with Concentric Ring Sources and Segmented Ring Sources for 3 Precursors.

(1) gives the dimension of a system using concentric ring design protected by Benvenuti [Erreur ! Source du renvoi introuvable.], for a substrate $r_{sub}=75$ mm. F represents the normalizing factors to use on the total flows of precursor A, B and C so as to obtain identical total flows on the substrate. (2) presents the radial distribution of the 3 precursors respectively. The average PIE value PIEav and an estimate of the system volume based on the larger R and h is also given. (3) presents the data from Table 1 from which the dimensions reported in (4) are calculated for a $r_{sub}=75$ mm substrate, for a segmented configuration, with alternating precursors A, B and C. (5) presents the radial flow, calculated from initial value of Table 1 (curve F T1), calculated at different angles (curves Fa1, Fa2 and Fa3) and calculated neglecting the radial inhomogeneity (curve Fc). The distribution are almost identical for the 3 precursors (slight differences due to the angle rotation), and the PIE and V values are reported.

Although the chosen examples may not be the best possible for the flow homogeneity around 1.5% chosen, the segmented system shows its optimisation with a PIE 1.6 times higher and a volume estimate 2.6 times lower.

(FIG. 13)

Self patterning of deposits in trenches or cavities playing on activation energy modification of precursor 1 (a+a') by precursor 2 (b+b') providing relative flow modulation up to total growth inhibition. Several configurations and examples are shown to grow complex 3D structures.

Figure 14:
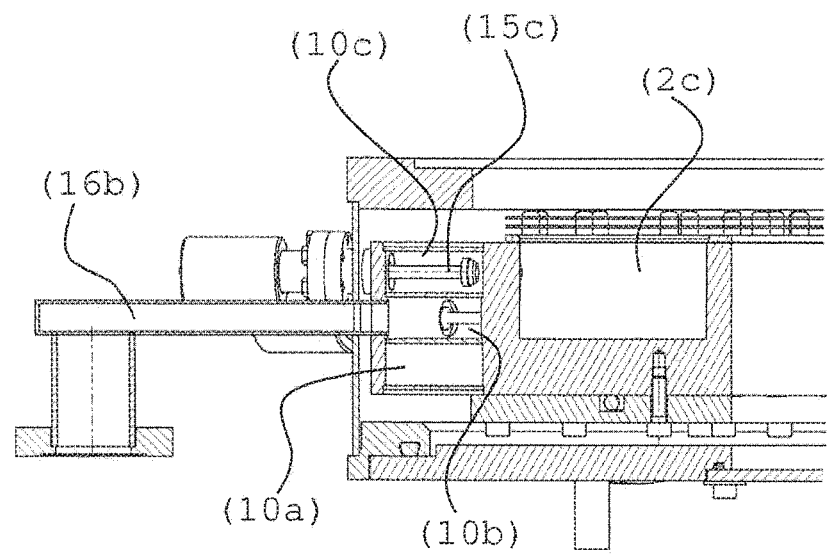
FIG. 14—bidimensional longitudinal section of FIG. 3B.

FIG. 14 (FIG. 14) is a bidimensional longitudinal section of the system shown in FIG. 3B with the homogenizing rings (10), the pre-chamber (2), the valves (15) regulating precursor flow to the pre-chamber from the homogenizing ring, and the lines (16) feeding precursors to homogenizing ring. The elements of the system are further referenced with letters a, b, or c, after the number, depending on the precursor (A, B, or C) flowing in each element.

Figure 15:
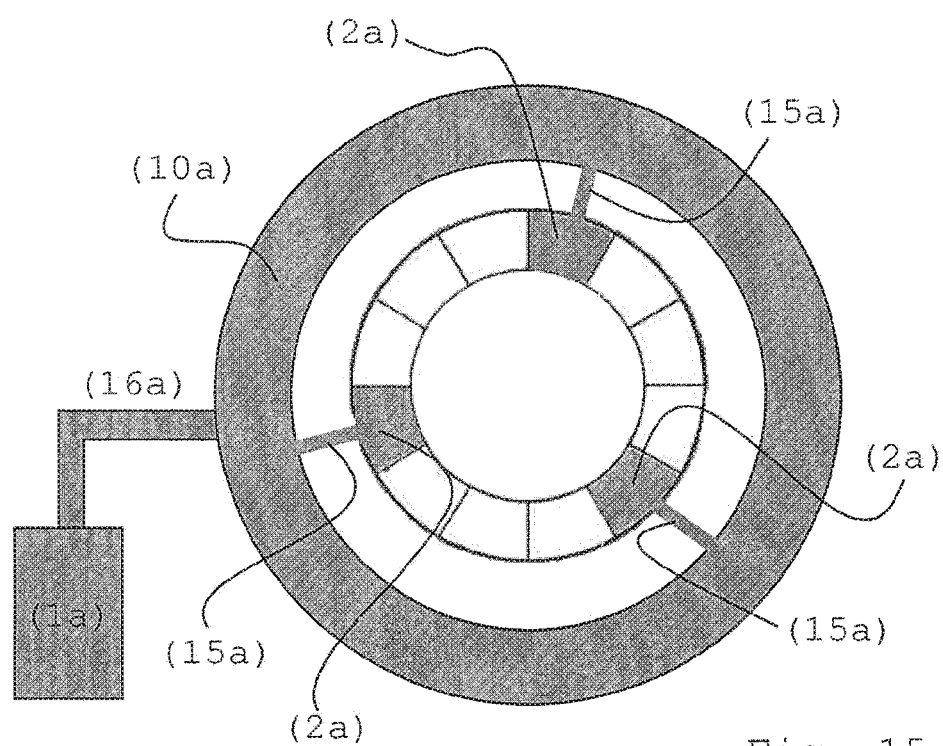
FIG. 15—schematic view of the showerhead with reservoir, homogenizing ring and pre-chambers assembly.

FIG. 15 (FIG. 15) is a schematic view of the showerhead of the invention. The figure shows the assembly, for precursor species A, of the reservoir (reservoir 1a), the homogenizing ring (10a) and the pre-chambers (2a): the precursor A alimenting lines (16a) and the valves (15a) regulating alimentation of the three compartments for precursor A.

REFERENCES

[1] C. R. Abernathy. Compound semiconductor growth by metalorganic molecular-beam epitaxy (MOMBE). *Materials Science & Engineering R-Reports*, 14(5):203-253, May 1995.

[2] R. Adomaitis, J R. Kidder, and G. W. Rubloff. Spatially programmable microelectronics process equipment using segmented gas injection showerhead with exhaust gas recirculation. Patent WO0208487, January 2002. Applicant University of Maryland (US).

[3] H. Ando, S. Yamaura, and T. Fujii. Recent progress in the multi-wafer cbe system. *Jounal Of Crystal Growth*, 164 (1-4):1-15. July 1996.

[4] R. Bellman and R. Raj. Design and performance of a new type of knudsen cell for chemical beam epitaxy using metal-organic precursors. *Vacuum*, 48(2): 165-173, February 1997.

[5] G. Benvenuti, E. Halary-Wagner, S. Amorosi, and P. Hoffmann. Large area deposition in high vacuum with high thickness uniformity. Patent EP1504136. November 2003. Applicant: Ecole Polytechnique Federale de Lausanne (CH).

[6] G. Benvenuti, E. Halary-Wagner, A. Brioude, and P. Hoffmann. High uniformity deposition with chemical beams in high vacuum. *Thin Solid Films*. 427(1-2):411-416, 2003.

[7] C. T. Campbell and S. M. Valone. Design considerations for simple gas dosers in surface science applications. *Journal Of Vacuum Science & Technology A—Vacuum Surfaces And Films*, 3(2):408-411, 1985.

[8] J. O. Choo, R. A. Adomaitis, L. Henn-Lecordier. Y. Cai, and G. W. Rubloff. Development of a spatially controllable chemical vapor deposition reactor with combinatorial processing capabilities. *Review Of Scientific Instruments*, 76(6):062217, June 2005.

[9] J. A. Crawley and V. J. Saywell. Apparatus for chemical vapour deposition. Patent EP0687749, December 1995. Applicant SWAN THOMAS & CO LTD.

[10] J. A. Dobrowolski, M. Ranger, and R. L. Wilkinson. Measurements of angular evaporation characteristics of sources. *Journal Of Vacuum Science & Technology A—Vacuum Surfaces And Films*, 1(3): 1403-1408, 1983.

[11] T. Fujimoto, B. Q. Li, I. Kojima. S. Yokoyama, and S. Murakami. An ultrahigh vacuum sputtering system with offset incidence magnetron sources onto a rotating substrate. *Review Of Scientific Instruments*, 70(11):4362-4365, 1999.

[12] J. Greenwood. The correct and incorrect generation of a cosine distribution of scattered particles for monte-carlo modelling of vacuum systems. *Vacuum*, 67(2):217-222, 2002.

[13] J. M. Guevremont, S. Sheldon, and F. Zaera. Design and characterization of collimated effusive gas beam sources: Effect of source dimensions and backing pressure on total flow and beam profile. *Review Of Scientific Instruments*, 71(10):3869-3881, October 2000.

[14] R. A. Hamm. D. Ritter, and H. Temkin. Compact metalorganic molecular-beam epitaxy growth system. *Journal Of Vacuum Science & Technology A—Vacuum Surfaces And Films*, 12(5):2790-2794, September 1994.

[15] H. Heinecke. Potentiality and challenge of metalorganic molecular-beam epitaxy. *Materials Science And Engineering B—Solid State Materials For Advanced Technology*, 9(1-3):83-91, July 1991.

[16] I. P. Herman. Laser-assisted deposition of thin-films from gas-phase and surface-adsorbed molecules. *Chemical Reviews*, 89(6): 1323-1357, September 1989.

[17] L. Holland and W. Steckelmacher. The distribution of thin films condensed on surfaces. *Vacuum*, 11(4):346-364, 1952.

[18] Y. M. Houng. Chemical beam epitaxy. *Critical Reviews In Solid Stale And Materials Sciences*. 17(4):277-306, 1992.

[19] G. Hyett and I. P. Parkin. A combinatorial approach to phase synthesis and characterisation in atmospheric pressure chemical vapour deposition. *Surface & Coatings Technology*, 201(22-23):8966-8970, September 2007.

[20] S. Izumi, Y. Kouji, and N. Hayafuji. Multiwafer gas source molecular beam epitaxial system for production technology. *Journal Of Vacuum Science & Technology B*, 17(3):1011-1016, May 1999.

[21] V. A. Joshkin. P. Moran. D. Saulys, T. F. Kuech. L. McCaughan, and S. R. Oktyabrsky. Growth of oriented lithium niobate on silicon by alternating gas flow chemical beam epitaxy with metalorganic precursors. *Applied Physics Letters*, 76(15):2125-2127. April 2000.

[22] S. J. Kim, P. S. Cho, J. H. Lee. C. Y. Kang, J. S. Kim, and S. J. Yoon. Preparation of multi-compositional gas sensing films by combinatorial solution deposition. *Ceramics International*, 34(4):827-831, May 2008.

[23] D. E. Kuhl and R. G. Tobin. On the design of capillary and effusive gas dosers for surface science. *Review Of Scientific Instruments*, 66(4):3016-3020. April 1995.

[24] F. Lelarge, J. J. Sanchez, F. Gaborit, and J. L. Gentner. Multiwafer gas source mbe development for ingaasp/inp laser production. *Journal Of Crystal Growth*, 251(1-4): 130-134, April 2003.

[25] M. R. Leys. Fundamental growth kinetics in mombe/cbe, mbe and movpe. *Journal Of Crystal Growth*, 209(2-3):225-231. February 2000.

[26] M. Lippmaa, T. Koida, H. Minami, Z. W. Jin. M. Kawasaki, and H. Koinuma. Design of compact pulsed laser deposition chambers for the growth of combinatorial oxide thin film libraries. *Applied Surface Science*, 189(3-4):205-209, 2002.

[27] H. Luth. Chemical beam epitaxy—a child of surface science. *Surface Science*, 300(1-3):867-877. January 1994.

[28] B. Marheineke, M. Popp, and H. Heinecke. Growth of gainas(p) using a multiwafer mombe. *Journal Of Crystal Growth*. 164(1-4):16-21, July 1996.

[29] T. Martin, C. R. Whitehouse, and P. A. Lane. Growth reactions and mechanisms in chemical beam epitaxy (cbe). *Journal Of Crystal Growth*, 120(1-4):25-32. May 1992.

[30] J. D. Perkins, J. A. del Cueto, J. L. Alleman, C. Warmsingh, B. M. Keyes, L. M. Gedvilas, P. A. Parilla, B. To, D. W. Readey, and D. S. Ginley. Combinatorial studies of zn-al-o and zn-sn-o transparent conducting oxide thin films. *Thin Solid Films*, 411(1): 152-160, 2002.

[31] M. Reinhold, P. Baumann, and G. Strauch. Gas distributor with pre-chambers arranged in planes. Patent WO2006082117, August 2006. Applicant AIXTRON.

[32] D. Rende, K. Schwarz, U. Rabe. W. F. Maier, and W. Arnold. Combinatorial synthesis of thin mixed oxide films and automated study of their piezoelectric properties. *Progress In Solid State Chemistry*, 35(2-4):361-366, 2007.

[33] D. A. Scheinowitz, J. Trommel, K. Werner, S. Radelaar, and P. Balk. Comparative-study of molecular-beam injection systems for gas-source molecular-beam epitaxy. *Journal Of Crystal Growth*, 127(1-4):986-989, February 1993.

[34] D. A. Scheinowitz, K. Werner, and S. Radelaar. Capillary arrays with variable channel density—an improved gas injection system. *Journal Of Vacuum Science & Technology A—Vacuum Surfaces And Films*, 12(6):3228-3232, November 1994.

[35] L. F. Schneemeyer, R. B. van Dover, and R. M. Fleming. High dielectric constant hf-sn-ti-o thin films. *Applied Physics Letters*. 75(13): 1967-1969, September 1999.

[36] R. Sreenivasan, R. A. Adomaitis, and G. W. Rubloff. Demonstration of spatially programmable chemical vapor deposition: Model-based uniformity/nonuniformity control. *Journal Of Vacuum Science & Technology B*, 24(6): 2706-2715. November 2006.

[37] W. Steckelmacher. Knudsen-flow 75 years on—the current state-of-the-an for flow of rarefied-gases in tubes and systems. *Reports On Progress In Physics*, 49(10): 1083-1107, October 1986.

[38] T. A. Stegk. R. Janssen, and G. A. Schneider. High-throughput synthesis and characterization of bulk ceramics from dry powders. *Journal Of Combinatorial Chemistry*, 10(2):274-279, March 2008.

[39] R. Takahashi, Y. Matsumoto, H. Koinuma. M. Lippmaa, and M. Kawasaki. Combinatorial optimization oxide films by the carrousel of atomically controlled growth for type laser molecular beam epitaxy. *Applied Surface Science*, 197:532-535, 2002.

[40] G. Teeter. Conceptual design of a deposition system for uniform and combinatorial synthesis of multinary thin-film materials via open-boat physical-vapor deposition. *Journal Of Vacuum Science & Technology A*, 24(4):1119-1127, July 2006.

[41] G. Teeter. Physical-vapor deposition flux-distribution calculations for static and rotating substrates: Derivation of the deposition geometry for optimal film-thickness uniformity. *Journal Of Vacuum Science & Technology A*, 24(4): 1112-1118, July 2006.

[42] W. T. Tsang. *Chemical Beam Epitaxy and Related Techniques*. Wiley, 1997.

[43] E. VEUHOFF, W. PLETSCHEN, P. BALK, and H. LUTH. Metalorganic cvd of gaas in a molecular-beam system. *Journal Of Crystal Growth*, 55(1):30-34, 1981.

[44] R. M. Wallace and B. E. Gnade. Directed effusive beam atomic layer epitaxy system and method. U.S. Pat. No. 5,316,793, July 1992. Applicant Texax Instrument.

[45] M. Woodhouse and B. A. Parkinson. Combinatorial discovery and optimization of a complex oxide with water photoelectrolysis activity. *Chemistry Of Materials*, 20(7): 2495-2502, April 2008.

[46] B. Xia. F. Chen, S. A. Campbell, J. T. Roberts, and W. L. Gladfelter. Combinatorial cvd of zirconium, hafnium, and tin dioxide mixtures for applications as high-k materials. *Chemical Vapor Deposition*, 10(4): 195-200, 2004.

[47] L. J. Zhong, Z. H. Zhang. S. A. Campbell, and W. L. Gladfelter. Combinatorial cvd of zro2 or hfo2 compositional spreads with sio2 for high kappa dielectrics. *Journal Of Materials Chemistry*. 14(21):3203-3209, 2004.

What is claimed is:

1. A process for vacuum deposition of one or more species onto a substrate, comprising:
    providing a substrate (6) for thin film growth in a growth chamber;
    providing two or more species to be effused towards the substrate, wherein:
        at least one of the two or more species is a chemical precursor decomposing onto the substrate at a decomposition temperature, and
        at least one of the two or more species is a different chemical precursor that is not incorporated or that is only partially incorporated into a thin film deposited onto the substrate;
    effusing said two or more species towards the substrate with line-of sight propagation and in high vacuum conditions,
        so that the chemical precursor decomposing on the substrate at a decomposition temperature is incorporated as an element into the thin film deposited on the substrate
        and the different chemical precursor enhances, inhibits or assists the growth of the chemical precursor constituting elements onto the substrate, by reducing or increasing the decomposition temperature of said chemical precursor decomposing on the substrate and/or by modifying the incorporation growth, the morphology or the crystalline phase of the element incorporated into the thin film, and/or by reducing contamination;
    obtaining a thin film with gradients of chemical elements composition, morphology or crystalline phase.

2. The process of claim 1 further comprising:
    modulating flow intensities of said two or more species, as the function of the position on the substrate, to achieve modulation of the incorporation growth, morphology or crystalline phase of the precursors onto the substrate.

3. The process of claim 1 further comprising:
    providing ad-hoc patterned surfaces to have short scale-modification of flow ratios, thus improving or modifying chemical composition, crystalline phase or morphology of the incorporated elements.

4. The process of claim 1,
    wherein interaction of the different chemical precursor with the molecules of the chemical precursor decomposing onto the substrate and contributing to the film growth occurs on the substrate surface and interactions of species in the gas phase is avoided.

5. The process of claim 1,
    further comprising:
    providing a showerhead for effusing the two or more species towards the substrate, said showerhead comprising a pre-chamber (2) divided into several independent compartments containing one of the two or more species to be effused.

6. The process of claim 5, wherein the showerhead for effusing species towards the substrate comprises a ring shaped upper wall divided into several quarters, each of said quarters of the wall containing at least one outlet (3) for at least one of said two or more species, wherein each of said quarters of the ring shaped upper wall define the wall of one of the underlying several independent compartments of the pre-chamber (2), wherein two adjacent compartments contain a different one of the two or more species, wherein at least three compartments contain the same one of the several species, wherein the showerhead further comprises homogenizing compartments which have a ring shape and are positioned before the pre-chamber (2), to improve the pressure and flow uniformity of the several species flowing into the quarters and to improve the control of species distribution, said homogenizing compartment (10) being connected to the pre-chamber's compartments through a series of apertures evenly distributed in a way to ensure direct lateral introduction of the species into the compartments.

* * * * *